United States Patent
Tsudaka

[19]

[11] Patent Number: 5,825,647
[45] Date of Patent: Oct. 20, 1998

[54] CORRECTION METHOD AND CORRECTION APPARATUS OF MASK PATTERN

[75] Inventor: Keisuke Tsudaka, Kanagawa, Japan

[73] Assignee: Sony Corporation, Tokyo, Japan

[21] Appl. No.: 614,313

[22] Filed: Mar. 12, 1996

[30] Foreign Application Priority Data

Mar. 13, 1995 [JP] Japan .................................. 7-053053

[51] Int. Cl.⁶ ............................ G06F 19/00; G06F 15/00
[52] U.S. Cl. .............................. 364/167.03; 364/468.28
[58] Field of Search ..................... 364/167.02, 468.28, 364/167.03, 488–491

[56] References Cited

U.S. PATENT DOCUMENTS 5,124,931  6/1992  Iwamatsu et al. ..................... 364/489
5,206,820  4/1993  Ammann et al. ....................... 364/559
5,656,402  8/1997  Kasuga ..................................... 430/22

Primary Examiner—Paul P. Gordon
Attorney, Agent, or Firm—Hill & Simpson

[57] ABSTRACT

A method of correction of a mask pattern in which the mask pattern of a photomask to be used in a photolithographic step is deformed so that a transfer image near a desired design pattern is obtained, including an evaluation point arrangement step for arranging a plurality of evaluation points along an outer periphery of the desired design pattern; a simulation step for simulating the transfer image to be obtained where exposure is carried out under predetermined transfer conditions by using a photomask of a design pattern given the evaluation points; a comparison step for comparing a difference between the simulated transfer image and the design pattern for every evaluation point; and a deformation step for deforming the design pattern according to the difference compared for every evaluation point so that the difference becomes smaller and a correction apparatus for the same.

12 Claims, 43 Drawing Sheets

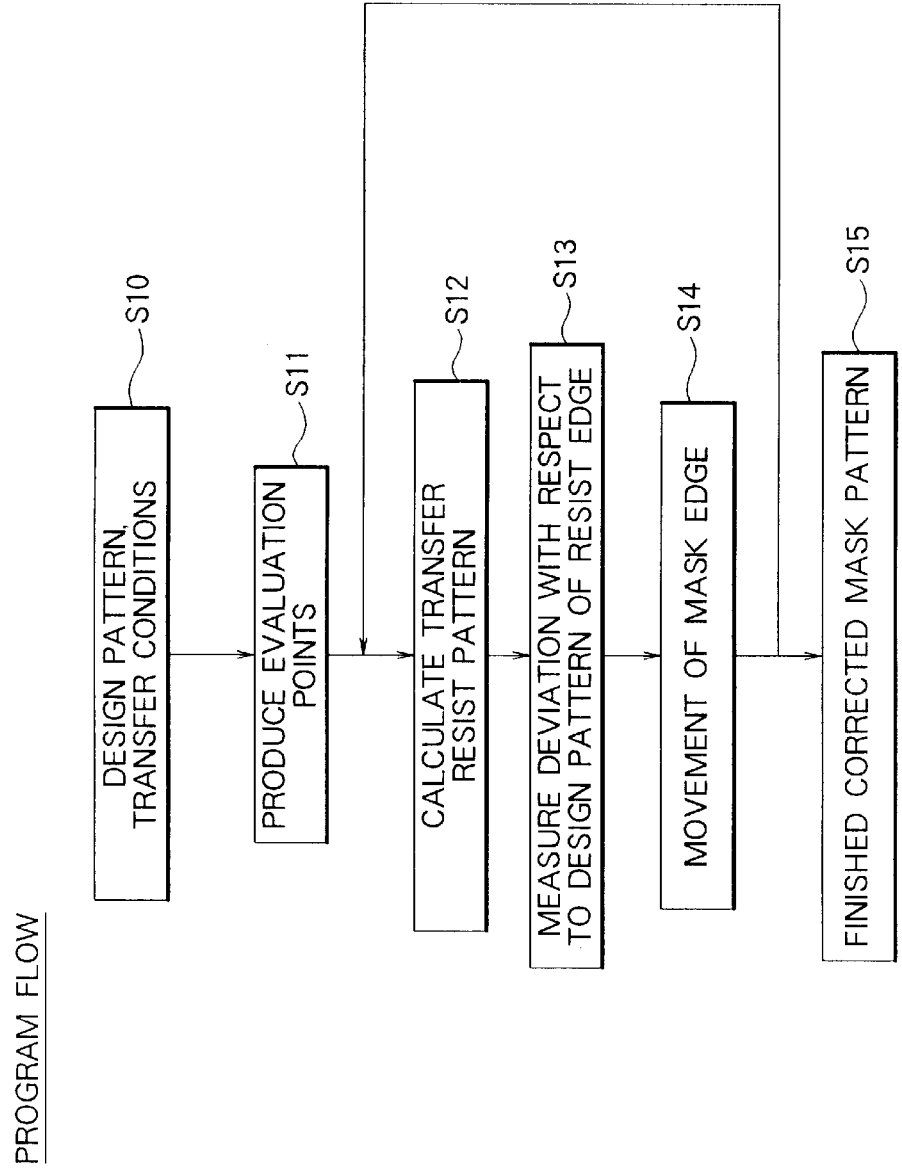

CORRECTION METHOD

MEASURE MAGNITUDE OF DEVIATION OF RESIST EDGE FOR EVERY EVALUATION POINT

MOVE MASK PATTERN EDGE BY EXACTLY AMOUNT OBTAINED BY MULTIPLYING MAGNITUDE OF EDGE DEVIATION BY COEFFICIENT (CAN BE SET)

$\alpha$:0.131　　Eth:197.01　　3$\sigma$:0.0153

| DEFOCUS μm | EXPOSURE TIME sec | SEM μm | PRESENT METHOD μm | DIFFERENCE μm |
|---|---|---|---|---|
| 0 | 475 | 0.482 | 0.472 | -0.01 |
| 0 | 500 | 0.458 | 0.449 | -0.009 |
| 0 | 525 | 0.437 | 0.429 | -0.008 |
| 0 | 550 | 0.412 | 0.412 | 0 |
| 0 | 575 | 0.394 | 0.395 | 0.001 |
| 0 | 600 | 0.38 | 0.38 | 0 |
| 0 | 625 | 0.336 | 0.366 | 0 |
| 0 | 650 | 0.357 | 0.353 | -0.004 |
| 0 | 675 | 0.347 | 0.34 | -0.006 |
| 0 | 700 | 0.333 | 0.329 | -0.004 |
| 0 | 725 | 0.322 | 0.319 | -0.003 |
| -1 | 555 | 0.408 | 0.414 | 0.006 |
| -0.8 | 555 | 0.404 | 0.411 | 0.007 |
| -0.6 | 555 | 0.404 | 0.41 | 0.006 |
| -0.4 | 555 | 0.403 | 0.409 | 0.006 |
| -0.2 | 555 | 0.402 | 0.408 | 0.006 |
| 0 | 555 | 0.405 | 0.408 | 0.003 |
| 0.2 | 555 | 0.41 | 0.408 | -0.002 |
| 0.4 | 555 | 0.407 | 0.409 | 0.002 |
| 0.6 | 555 | 0.406 | 0.41 | 0.004 |
| 0.8 | 555 | 0.413 | 0.411 | -0.002 |

$\alpha$:0.0    Eth:193.54    3$\sigma$:0.0313

| DEFOCUS μm | EXPOSURE TIME sec | SEM μm | PRESENT METHOD μm | DIFFERENCE μm |
|---|---|---|---|---|
| 0 | 475 | 0.482 | 0.454 | -0.028 |
| 0 | 500 | 0.458 | 0.437 | -0.021 |
| 0 | 525 | 0.437 | 0.422 | -0.015 |
| 0 | 550 | 0.412 | 0.409 | -0.003 |
| 0 | 575 | 0.394 | 0.397 | 0.003 |
| 0 | 600 | 0.38 | 0.385 | 0.005 |
| 0 | 625 | 0.336 | 0.375 | 0.009 |
| 0 | 650 | 0.357 | 0.365 | 0.008 |
| 0 | 675 | 0.347 | 0.356 | 0.009 |
| 0 | 700 | 0.333 | 0.347 | 0.014 |
| 0 | 725 | 0.322 | 0.339 | 0.017 |
| -1 | 555 | 0.408 | 0.411 | 0.003 |
| -0.8 | 555 | 0.404 | 0.409 | 0.005 |
| -0.6 | 555 | 0.404 | 0.408 | 0.004 |
| -0.4 | 555 | 0.403 | 0.407 | 0.004 |
| -0.2 | 555 | 0.402 | 0.407 | 0.005 |
| 0 | 555 | 0.405 | 0.406 | 0.001 |
| 0.2 | 555 | 0.41 | 0.407 | -0.003 |
| 0.4 | 555 | 0.407 | 0.407 | 0 |
| 0.6 | 555 | 0.406 | 0.408 | 0.002 |
| 0.8 | 555 | 0.413 | 0.409 | -0.004 |

JUST FOCUS 0.75 μm DEFOCUS

JUST FOCUS 0.75 μm DEFOCUS

JUST FOCUS 0.75 μm DEFOCUS

*UNIT σ

JUST FOCUS 0.50 μm DEFOCUS

CORRECTION METHOD AND CORRECTION APPARATUS OF MASK PATTERN

BACKGROUND OF THE INVENTION

1. Field of the Invention

The present invention relates to a method of correction of a mask pattern which causes the mask pattern of a photomask used in the production of for example a semiconductor device to deform so as to give a transfer image close to a desired design pattern, a correction apparatus for executing that method of correction, a photomask obtained by that method of correction, a method of exposure performing exposure by using a photomask having that corrected mask pattern, a semiconductor device produced by performing photolithographic processing using a photomask having that corrected mask pattern, an apparatus for production of a photomask utilizing that method of correction, and an apparatus for production of a semiconductor device.

2. Description of the Related Art

In the production of a semiconductor device etc., the so-called photolithographic step of transferring a mask pattern of a photomask to a resist material on the semiconductor substrate by using light for exposure is indispensable.

In recent years, the miniaturization of the semiconductor devices to be prepared has been accompanied by an increasingly smaller design rule. Photolithographic processing approaching the limit of the theoretical resolution is now being carried out. For this reason, the resolution has become insufficient and there has arisen a problem of the disparity between the design mask pattern and the transferred resist pattern.

When such disparity occurs, problems such as deterioration of the performance of the device due to the deformation of the transfer pattern and a reduction of the manufacturing yield due to the bridging of the pattern (erroneous connection between parts of the pattern) and disconnection are induced.

Therefore, in the related art, to obtain a desired resist pattern, the mask pattern has been optimized by a trial and error procedure. For example, a plurality of modifying patterns are added to an individual design pattern based on experience, a transfer pattern is found by simulation from transfer experiments based on the mask pattern to which those modifying patterns were added, and the modifying pattern with which the transfer pattern closest to the design pattern is given is found by the trial and error system.

Further, recently, a method has been developed of automatically optimizing the mask pattern on a computer by correcting the optical proximity effect. In this system for correcting the optical proximity effect, a mask pattern which is deformed so that the transfer image is improved over the input design pattern is found by calculation.

However, these conventional technologies have the following problems.

In the conventional trial and error system, an enormous amount of time and number of steps are required for finding the optimum mask pattern, so this system can only be applied to restricted patterns. Accordingly, there was a problem that this system could not be applied to the correction of a mask pattern of a semiconductor device having an irregular pattern like an application-specific integrated circuit (ASIC).

Also, in the trial and error system, since the number of the mask patterns which can be evaluated is limited, there is a possibility that a better mask pattern might be overlooked and there was the problem that the precision of correction of the mask pattern was seriously limited.

For this reason, in recent years, technologies have been developed for automatically correcting mask patterns, but these already existing correction technologies have suffered from the following problems.

First, in the conventional automatic correction technology, no consideration is given to process margins such as margins of exposure or depth of focus, so there is a problem in that there sometimes occurs a case where the process margins such the margins of exposure and depth of focus are reduced. For this reason, there is a possibility that the manufacturing yield will rather be degraded by the automatic correction, so application of this to actual production processes has been difficult.

Also, in automatic correction, there is also proposed a method of finding the light intensity distribution by using simulation of the light intensity, using the contour lines sliced by the threshold value as the transfer image, and correcting the mask pattern so as to optimize this. In this method, however, the resist process is not considered, so the contour lines obtained by slicing the light intensity distribution do not coincide with the resist image obtained in the actual process and there is a problem that the resist image will not be sufficiently corrected even if correction is carried out.

Further, there is a problem that, in certain correction methods, distortion is generated in other portions by excessively correcting the corners of a pattern and the end portions of a line pattern, bridging of the resist pattern is caused when the amount of exposure or the focal position fluctuates, or a mask pattern which is difficult to fabricate is caused.

SUMMARY OF THE INVENTION

The present invention was made in consideration with the above actual situation and has as an object thereof to provide a method of correction of a mask pattern with which a mask pattern can be automatically corrected to give an actual resist pattern close to the design pattern, a correction apparatus for executing that method of correction, a photomask obtained by that method of correction, a method of exposure performing exposure by using a photomask having that corrected mask pattern, a semiconductor device produced by performing photolithographic processing using a photomask having that corrected mask pattern, an apparatus for production of a photomask utilizing that method of correction, and an apparatus for production of a semiconductor device.

So as to achieve the object, a first method of correction of a mask pattern according to the present invention comprises an evaluation point arrangement step for arranging a plurality of evaluation points along an outer periphery of the desired design pattern; a simulation step for simulating the transfer image to be obtained where exposure is carried out under predetermined transfer conditions by using a photomask of a design pattern given the evaluation points; a comparison step for comparing a difference between the simulated transfer image and the design pattern for every evaluation point; and a deformation step for deforming the design pattern according to the difference compared for every evaluation point so that the difference becomes smaller.

Preferably, the simulation step to the deformation step are repeated at least one time using the design pattern deformed by the deformation step.

According to the first method of correction of the mask pattern according to the present invention, it becomes possible to deform the mask pattern to automatically give a transfer image close to the desired design pattern without regard as to the shape of the mask pattern. Accordingly, the inconvenience possessed by the system of correcting each of a plurality of mask patterns by the trial and error system can be eliminated.

In a second method of correction of the mask pattern according to the present invention, in the simulation step, transfer images are simulated under a number of types of transfer conditions based on a combination of a plurality of amounts of exposure of a preliminarily set margin of exposure and a plurality of focal positions within the range of the preliminarily set depth of focus to obtain a plurality of transfer images; in the comparison step, the difference of each of the plurality of transfer images from the design pattern is compared for every evaluation point to calculate a plurality of types of differences for every evaluation point; and in the deformation step, the design pattern is deformed so that the plurality of types of differences for every evaluation point become small according to a predetermined reference.

The predetermined reference in the deformation step is a reference such that for example a mean value of the plurality of types of differences for every evaluation point becomes the minimum.

Also, as another predetermined reference, mention may be made of a reference such that the difference between the maximum difference and the minimum difference among the plurality of types of differences for every evaluation point becomes the minimum.

Further, as still another predetermined reference, mention may be made of a reference such that the square average of the plurality of types of differences for every evaluation point becomes the minimum.

By the second method of correction of the mask pattern according to the present invention, since consideration is given to the transfer image where the transfer condition changes within the range of the processing margin (processing margin is considered), the processing margin, that is, the margin of exposure and the depth of focus, based on the corrected mask pattern will no longer deteriorate. As a result, when photolithography is carried out by using a photomask of this mask pattern, the manufacturing yield will be improved.

In a third method of correction of a mask pattern according to the present invention, in the simulation step, the two-dimensional light intensities on a substrate are calculated based on the design pattern and exposure conditions; the influences of the light intensities at a plurality of peripheral positions on the exposure energy at an arbitrary position are calculated and cumulatively added based on the light intensities at the peripheral positions of that arbitrary position on the two-dimensional plane of the substrate and the distance between that particular position and the peripheral positions, whereby a latent image formation intensity at that arbitrary position is calculated on the two-dimensional plane of the substrate; a distribution of the latent image formation intensities on the two-dimensional plane of the substrate is found; the threshold value of the latent image formation intensity corresponding to the amount of exposure and development conditions is determined; contour lines at the threshold value are found for the distribution of the latent image formation intensities; and the pattern defined by the contour lines is calculated as a transfer image.

Preferably the method of calculating and cumulatively adding the influence on the exposure energy at that arbitrary position from the peripheral positions calculates and cumulative adds the influence of the light intensities at the plurality of peripheral positions by the product of the light intensities at the peripheral positions and a function which uses the distance between the arbitrary position and the peripheral positions as a factor, becomes the maximum when the distance is 0, and becomes zero when the distance is infinite.

It is also possible if the method of calculating and cumulatively adding the influence on the exposure energy at the arbitrary position from the peripheral positions is a method of calculating and cumulatively adding the influence by the light intensities at the plurality of peripheral positions by the product of the power of the light intensities at the peripheral positions and a function which uses the distance between the arbitrary position and the peripheral positions as the factor, becomes the maximum when the distance is 0 and becomes zero when the distance is infinite.

As the function, for example a Gaussian function can be mentioned.

The third method of correction of a mask pattern according to the present invention is not one which uses the threshold value of a simple two-dimensional light intensity distribution as the transfer image. If the threshold value of the simple two-dimensional light intensity distribution were used as the transfer image, when the peak of the light intensity distribution was high as shown in FIG. 7A, the line width L of the resist pattern which is actually formed would become thicker in comparison with the line width 1 by the simulation defined by the threshold value Eth, and conversely when the peak of the light intensity distribution was low as shown in FIG. 7B, the line width L of the resist pattern to actually formed would tend to become thinner. The present inventors, considering this point, discovered that the elements contributing to the formation of the resist pattern at the particular point included not only the light intensity at the arbitrary point, but also the light intensities of the points around the arbitrary point.

Therefore, the present inventors newly created the concept of the latent image formation intensity based on the above discovery, found the distribution of the latent image formation intensities, set the threshold value and calculated the resist pattern, and consequently found that this result coincided very well with the actually obtained resist pattern.

Here, the latent image formation intensity is a concept determined by considering not only the light intensity at an arbitrary position, but also the influence of the light intensities at the peripheral positions thereof on the exposure energy at the arbitrary point.

By the fourth method of correction of the mask pattern according to the present invention, it becomes possible to bring the transfer image transferred by the design pattern (including also the deformed design pattern) close to the transfer image obtained by an actual transfer process and therefore enable automatic correction of the mask pattern with a high precision.

The fourth method of correction of a mask pattern according to the present invention is characterized in that, in the deformation step, the boundary line of the mask pattern in the vicinity of the evaluation point is moved in a reverse direction of the difference compared for every evaluation point by exactly an amount obtained by multiplying the magnitude of the difference by a constant coefficient.

Preferably the coefficient is larger than 0 and less than 1.

By the fourth method of correction of a mask pattern according to the present invention, when deforming the mask pattern, the boundary line of the mask pattern in the vicinity of the evaluation point is moved in an reverse direction of the difference compared for every evaluation point by exactly an amount obtained by multiplying the magnitude of the difference by a constant coefficient. This coefficient is larger than 0 and less than 1.

For example, in photolithography near the resolution limit, a small change of the mask pattern exerts a great influence upon the actual transfer image. In the present invention, the mask pattern is corrected so as to move the boundary line of the mask pattern in the vicinity ofthe evaluation point in the reverse direction to the difference from the transfer image. For this reason, if the mask pattern is corrected with a magnitude equivalent to or larger than the difference at the evaluation point, the difference between the obtained transfer image and the mask pattern after correction is not reduced and thus there is a concern that proper correction calculation can not be carried out.

In the fourth method of correction of a mask pattern according to the present invention, since, when deforming the mask pattern, the boundary line of the mask pattern in the vicinity of the evaluation point is moved in the reverse direction of the difference compared for every evaluation point by exactly an amount obtained by multiplying the magnitude of the difference by a constant coefficient (larger than 0 and less than 1), the transfer image obtained by the mask pattern after the correction will gradually approach the design pattern.

The fifth method of correction of a mask pattern according to the present invention is characterized in that in the evaluation point arrangement step, a plurality of evaluation points are arranged along an outer periphery of the pattern of the desired design pattern and, at the same time, target points are set at predetermined evaluation points separate from the evaluation points; in the comparison step, the difference between the simulated transfer image and the design pattern is compared for every evaluation point at positions at which only the evaluation points are set and a difference of the target points and the transfer image is compared at the positions where the target points are set; and in the deformation step, the design pattern is deformed so that the difference becomes smaller depending upon the difference compared for every evaluation point or every target point.

Preferably the target points are set corresponding to the evaluation points positioned at a convex corner or a concave corner of the design pattern, the target points are determined inside the corner at the convex corners, and the target points are determined outside the corner at the concave corners.

For example, at the convex corner or the concave corner of the design pattern, if the evaluation point were positioned on these corners, if correction of the mask pattern were carried out in order to make the transfer image approach the evaluation point per se, there would be a concern that the transfer image at a position other than the corners would move away from the design pattern.

In the fifth method of correction of a mask pattern according to the present invention, for example, the target points are determined inside the corner at the convex corners, the target points are determined outside of the corner at the concave corners, and correction is applied to the design pattern so that the transfer image approaches these target points, so the transfer image can be made to approach the design pattern well as a whole. As a result, bridges, disconnections, etc. between the parts of the pattern can be prevented well.

A photomask according to the present invention is a photomask having a mask pattern corrected by using any of the first to fifth methods of correction of a mask pattern according to the present invention.

A method of exposure according to the present invention is a method of exposure performing exposure by using a photomask having a mask pattern corrected by using any of the first to fifth methods of correction of a mask pattern according to the present invention.

The method of exposure is not particularly limited and can be one using modified illumination, one using pupil filtering, and one using a phase shift mask such as a halftone system and a reversion system. The method of correction of a mask pattern according to the present invention can automatically perform the correction of a mask pattern well even in a case where modified illumination or a phase shift mask is used.

A semiconductor device according to the present invention is a semiconductor device produced by performing photolithographic processing by using a photomask having a mask pattern corrected by using any of the first to fifth methods of correction of a mask pattern according to the present invention.

A correction apparatus according to the present invention is an apparatus for executing any of the first to fifth methods of correction of the mask pattern according to the present invention.

The first correction apparatus according to the present invention has an evaluation point arrangement means for arranging a plurality of evaluation points along an outer periphery of a desired design pattern; a simulation means for simulating a transfer image obtained where exposure is carried out under predetermined transfer conditions by using a photomask of the design pattern given the evaluation points; a comparison means for comparing a difference between the simulated transfer image and the design pattern for every evaluation point; and a deformation means for deforming the design pattern according to the differences compared for every evaluation point so that the differences becomes smaller.

Preferably the apparatus has a repetition means for repeating the processing performed from the simulation means to the deformation means by one or more times by using the design pattern deformed by the deformation means.

Each means is constituted by program data which is stored in an operation circuit or a RAM, ROM, optical storage medium, or other storage means and processed by the CPU of a computer etc.

The second correction apparatus according to the present invention is comprised of the first correction apparatus wherein the simulation means has a means for obtaining a plurality of transfer images by respectively simulating transfer images under a plurality of types of transfer conditions based on the combination of a plurality of amounts of exposure of the preliminarily set margin of exposure and the plurality of focal positions within a preliminarily set depth of focus; the comparison means has a means for comparing the difference of each of the plurality of transfer images from the design pattern for every evaluation point to calculate the plurality of types of differences for every evaluation point; and the deformation means has a means for deforming the design pattern so that the plurality of types of differences for every evaluation point becomes smaller based on a predetermined reference.

The predetermined reference at the deformation means is a reference such that the mean value of the plurality of types of differences for every evaluation point becomes the minimum.

Alternatively, it is also possible if the predetermined reference in the deformation means is a reference such that the difference between the maximum difference and the minimum difference in the plurality of types of differences for every evaluation point becomes the minimum.

Alternatively, it is also possible if the predetermined reference in the deformation means is a reference such that a square average of the plurality of types of differences for every evaluation point becomes the minimum.

The third correction apparatus of a mask pattern according to the present invention is comprised of either of the first or second correction apparatuses wherein the simulation means has a means for calculating the two-dimensional light intensity on the substrate based on the design pattern and the exposure conditions; a means for calculating the latent image formation intensity at an arbitrary position on the two-dimensional plane of the substrate by calculating and cumulatively adding an influence of the light intensities at a plurality of peripheral positions on the exposure energy of the arbitrary position based on the light intensities at the peripheral positions of the arbitrary position on the two-dimensional plane of the substrate and the distance between the arbitrary position and the peripheral positions; a means for finding the distribution of the latent image formation intensities on the two-dimensional plane of the substrate; a means for determining a threshold value of the latent image formation intensity corresponding to the amount of exposure and the development conditions; a means for finding the contour lines at the threshold value for the distribution of the latent image formation intensities; and a means for calculating the pattern defined by the contour lines as the transfer image.

The fourth correction apparatus of a mask pattern according to the present invention is comprised of any of the first to third correction apparatuses wherein the deformation means has a means for moving the boundary line of the mask pattern in the vicinity of a evaluation point in a reverse direction of the difference compared for every evaluation point by exactly an amount obtained by multiplying the magnitude of the difference by a constant coefficient.

Preferably the coefficient is larger than 0 and less than 1.

The fifth correction apparatus of a mask pattern according to the present invention is comprised of any of the first to fourth correction apparatuses wherein the evaluation point arrangement means has a means for arranging a plurality of evaluation points along the outer periphery of the pattern of the desired design pattern and, at the same time, setting target points at predetermined evaluation points separate from the evaluation points; the comparison means has a means for comparing the difference between the simulated transfer image and the design pattern for every evaluation point at the positions at which only the evaluation points are set and comparing the difference of the target points and the transfer image at the positions where the target points are set; and the deformation means has a means for deforming the design pattern so that the difference becomes smaller according to the difference compared for every evaluation point or every target point.

The target points are set corresponding to for example the evaluation points positioned at a convex corner or a concave corner of the design pattern, the target points are determined inside the corner at the convex corners, and the target points are determined outside the corner at the concave corners.

A production apparatus of a photomask according to the present invention has any of the first to fifth correction apparatuses of the mask pattern and a drawing means for drawing a photomask of a mask pattern corrected by the correction apparatus of the mask pattern. The drawing means includes a printer such as a laser printer, an XY plotter, a facsimile apparatus, copying apparatus, etc. The correction apparatus of the mask pattern or the production apparatus of the photomask according to the present invention preferably includes also a display means such as a cathode ray tube (CRT) or liquid crystal display device which displays the corrected mask pattern on a screen.

The production apparatus of a semiconductor device according to the present invention has any of the first to fifth correction apparatuses of a mask pattern and an exposure means for performing exposure by using a photomask of a mask pattern corrected by the correction apparatus of a mask pattern. The exposure means is not particularly limited and can be one using modified illumination, one using pupil filtering, and one using a phase shift mask such as a halftone system or reversion system too.

BRIEF DESCRIPTION OF THE DRAWINGS

These and other objects and features of the invention will become more apparent from the following description of the preferred embodiments made with reference to the accompanying drawings, in which

FIG. 2 is a flow chart showing the procedure for performing correction of a mask pattern by using the correction apparatus shown in FIG. 1;

FIG. 5 is a view of the concept of one part of the procedure shown in FIG. 4;

DESCRIPTION OF THE PREFERRED EMBODIMENTS

Figure 1:
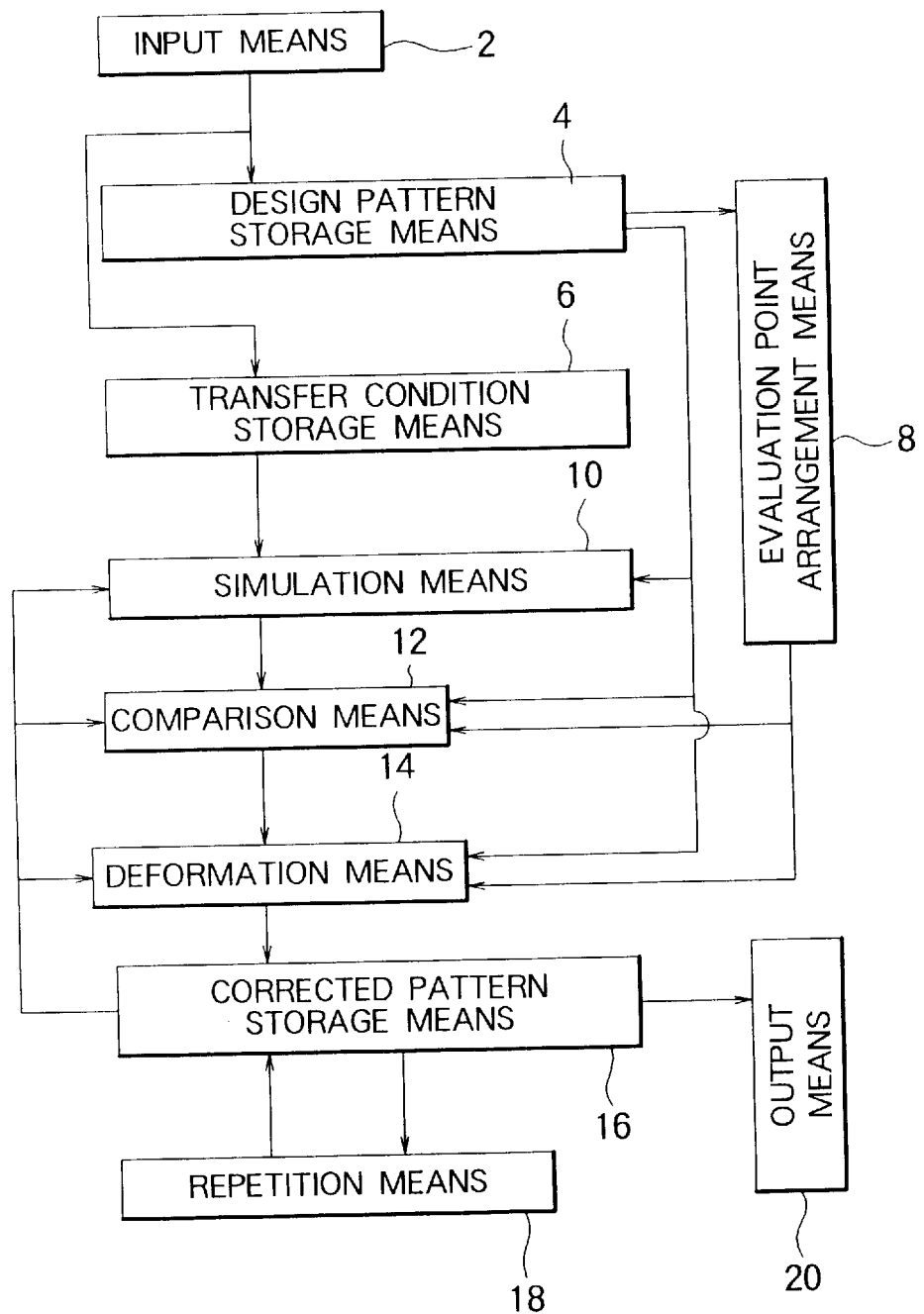
FIG. 1 is a schematic block diagram of a correction apparatus of a mask pattern according to one embodiment of the present invention.

Below, the present invention will be explained in detail based on the embodiments shown in the drawings.

First embodiment

A schematic block diagram of a correction apparatus of a mask pattern according to the present embodiment is shown in FIG. 1, and a schematic flow chart of the method of correction thereof is shown in FIG. 2.

As shown in FIG. 1, the correction apparatus of a mask pattern according to the present embodiment has an input means 2, a design pattern storage means 4, a transfer condition storage means 6, an evaluation point arrangement means 8, a simulation means 10, a comparison means 12, a deformation means 14, a corrected pattern storage means 16, a repetition means 18, and an output means 20.

The input means 2 is not particularly limited so long as it can receive as input the design pattern, the transfer conditions, etc. A keyboard, touch panel, etc. can be mentioned. Where the design pattern, the transfer conditions, etc. are input in the form of electric signals, the input means 2 can be a cable or wireless input terminal too. Also, where a design pattern, transfer conditions, etc. stored in a storage medium such as a floppy disc is input, the input means 2 is constituted by a disc drive or the like.

Also, as the output means 20, a CRT, a liquid crystal display device, or the like which can display at least a corrected design pattern on the screen can be used. Also, as the output means 20, it is also possible to adopt an output means such as a printer or XY plotter which can draw at least the corrected design pattern on paper, film, or another substrate.

The other means 4, 6, 10, 12, 14, 16, and 18 shown in FIG. 1 are constituted by program data stored in an operation circuit or a RAM, ROM, optical storage medium, or other storage means and processed by a CPU of a computer etc.

The mode of operation of the apparatus shown in FIG. 1 will be explained based on the flow chart shown in FIG. 2.

Figure 11:
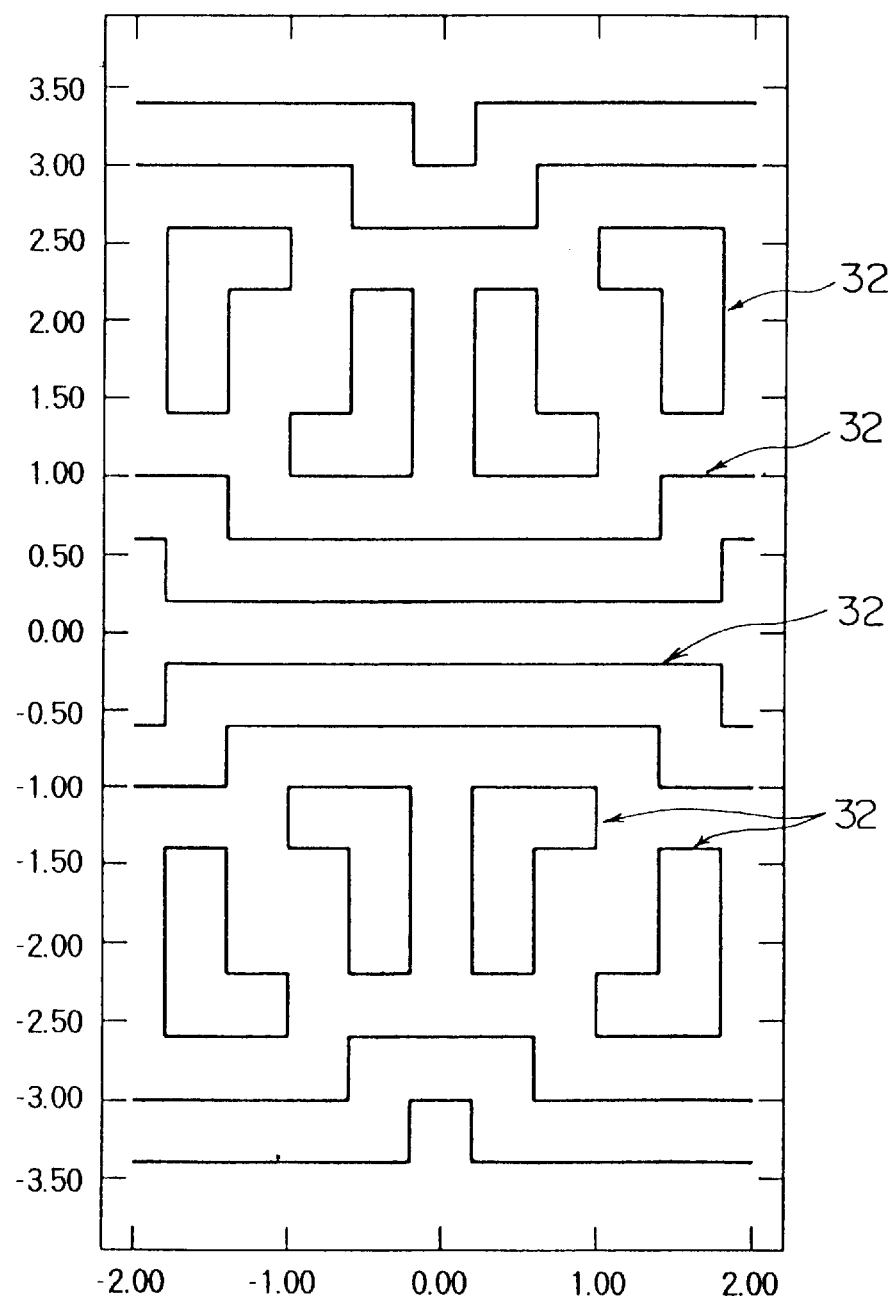
FIG. 11 is a plan view of the initial design pattern.

At step S10 shown in FIG. 2, the design pattern and the transfer conditions are stored from the input means 2 shown in FIG. 1 in a design pattern storage means 4 and a transfer condition storage means 6 of the correction apparatus shown in FIG. 1. One example of the design pattern is shown in FIG. 11.

The transfer conditions are conditions concerning for example the wavelength λ of light used for the exposure, the numerical aperture NA, the apparent size a of the light source (partial coherence) or distribution of transmittances of the light source, distribution of phase transmittance of the emission pupil, defocus, etc.

Figure 12:
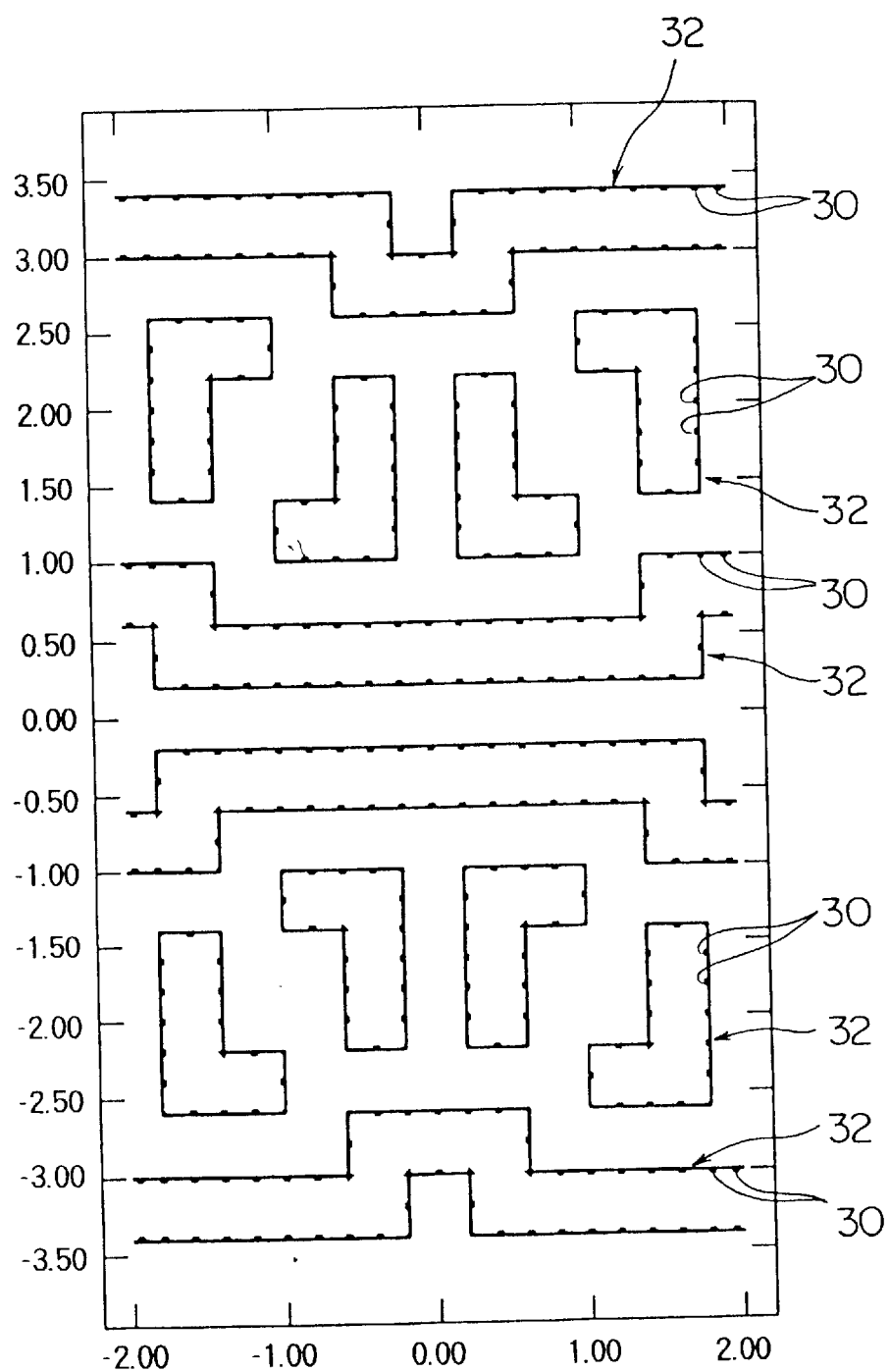
FIG. 12 is a plan view of one example of the method of arrangement of evaluation points.

Next, at step S11 shown in FIG. 2, a plurality of evaluation points are provided along the outer periphery of the design pattern. The evaluation points are provided by the evaluation point arrangement means 8 based on the design pattern stored in the design pattern storage means 4 shown in FIG. 1. For example, as shown in FIG. 12, the evaluation points 30 are given along the outer periphery of the design pattern 32 at equal intervals or at unequal intervals based on a constant rule. The interval of arrangement of the evaluation points 30 is for example of a size of about 0.2 μm.

Next, at step S12 shown in FIG. 2, a transfer resist pattern (transfer image) is calculated by the simulation means 10 shown in FIG. 1. As the simulation means 10, use can be made of a commercially available light intensity simulation which can simulate a transfer image by receiving as its input, for example, the exposure conditions and the design pattern. One part of the transfer image of the result of simulation is shown by a numeral 34 in FIG. 3.

Figure 3A:
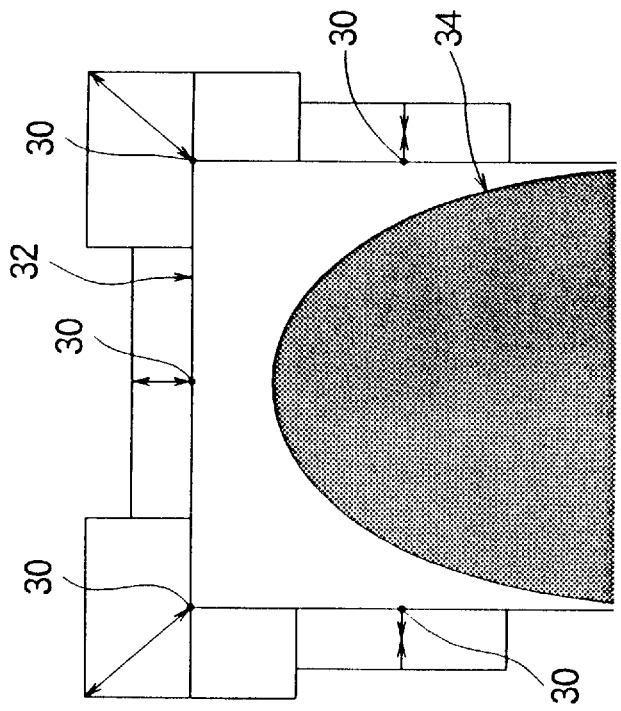
FIG. 3A is a schematic view of a method for measuring the deviation of the resist edge for every evaluation point.

Next, at step S13 shown in FIG. 2, the deviation (difference) of the resist edge with respect to the design pattern is calculated for the evaluation points 30 by the comparison means 12 shown in FIG. 1. The direction of measurement of the deviation of the resist edge position of the design pattern at this time is set to a perpendicular direction with respect to the boundary line (edge) of the design pattern 32 as shown in FIG. 3A at a portion other than the corner of the pattern, the outward direction of the design pattern 32 is defined as a positive direction, and the inside is defined as a negative direction. Also, in the corner of the design pattern 32, the direction of measurement of deviation is set to the direction of the sum of the directional vectors of the two sides constituting the corner and similarly the outside of the pattern is defined as the positive direction Next, at step S14 shown in FIG. 2, the design pattern 32 is deformed and corrected by the deformation means 14 shown in FIG. 14 according to the deviation (difference) compared for every evaluation point so that the difference becomes small. A schematic view of the corrective deformation method is shown in FIG. 3B.

Figure 3B:
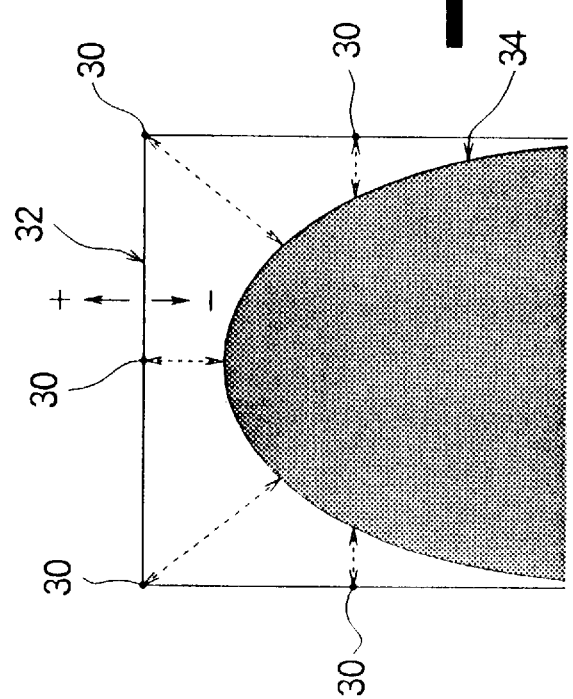
FIG. 3B is a schematic view of a corrective deformation step of a mask pattern.
Figure 15:
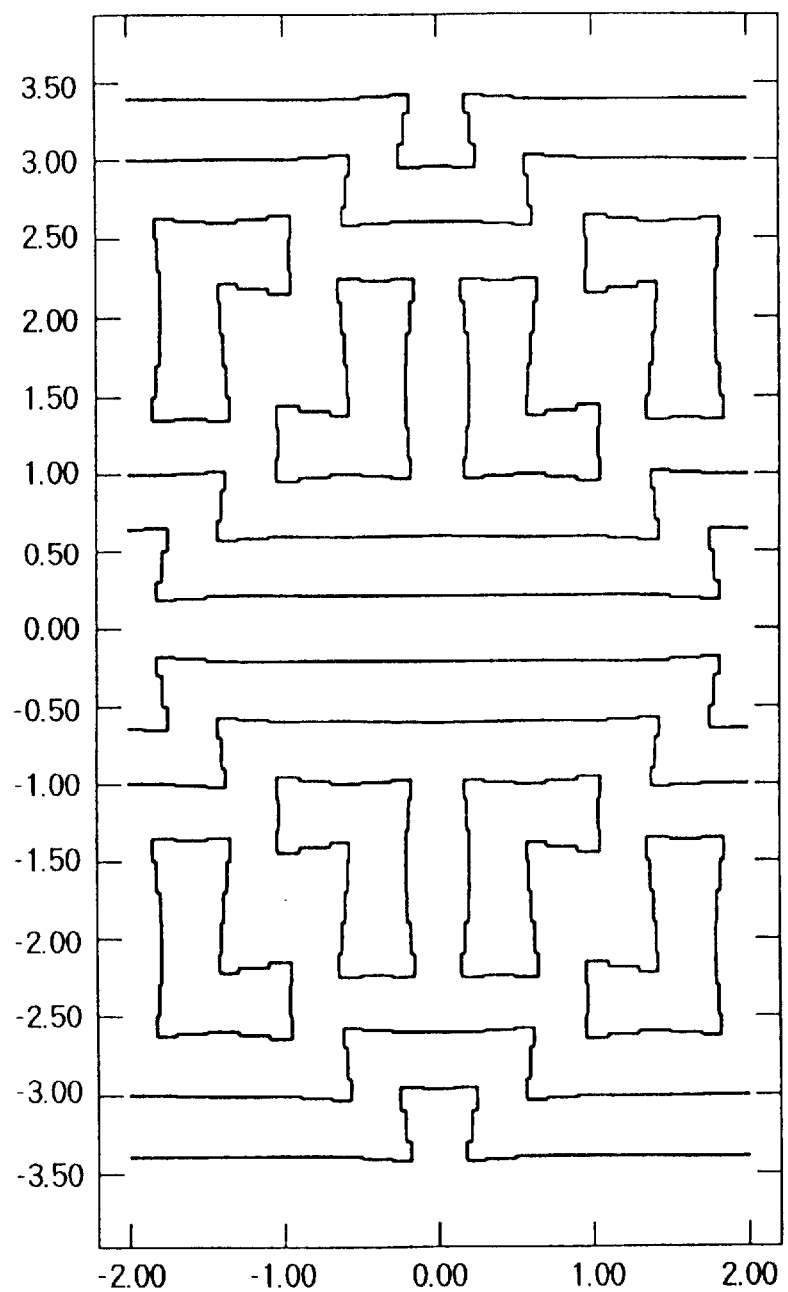
FIG. 15 is a plan view of one example of a mask pattern corrected by a single correction step.

As shown in FIGS. 3A and 3B, for the deformation and correction of the design pattern 32, the boundary line (including not only the evaluation point, but also the boundary line in the neighborhood thereof) of the mask pattern in the vicinity of the evaluation point 30 is moved in the reverse direction of the deviation (difference) compared for every evaluation point 30 by exactly an amount obtained by multiplying the magnitude of difference by a constant coefficient. The coefficient is preferably larger than 0 and less than 1, and further preferably 0.10 to 0.50. When this coefficient is too large, excessive deformation and correction occur and there is a concern that the transfer image will not approach the design pattern, but will conversely become even more different even by the repeated calculation mentioned later. Note that, it is possible if the coefficient is constant at all evaluation points or different at a specific evaluation point. One example of the design pattern corrected in this way is shown in FIG. 15.

The corrected design pattern is stored in the corrected pattern storage means 16 shown in FIG. 1. Where a good correction pattern is obtained by this series of operations, at step S15 shown in FIG. 2, the finished corrected mask pattern is obtained. The finished corrected mask pattern is output onto the screen or paper or film by the output means 20 shown in FIG. 1.

Note that, preferably, upon receipt of the signal of the repetition means 18 shown in FIG. 1, the steps of from S12 to S14 shown in FIG. 2 are repeated one or more times based on the corrected design pattern stored in the corrected pattern storage means 16 by using the simulation means 10, comparison means 12, and the deformation means 14. At this time, the position of the evaluation point 30 serving as the reference is not changed. Namely, the transfer image is found again based on the corrected design pattern, a deviation (difference) between the transfer image and the reference point is found, and the corrected design pattern is deformed and corrected again based on that difference. By repeating these operations, the transfer image will gradually approach the initial design pattern (position of evaluation point).

In the correction apparatus and method of correction of the present embodiment, the mask pattern of the photomask can be automatically deformed to give a transfer image close to the desired design pattern regardless of the design pattern. Accordingly, if photolithographic processing is carried out by using a photomask having a finished corrected design pattern obtained by the present embodiment, a resist pattern which is infinitely near the initial design pattern can be obtained and bridges, disconnections, etc. will not occur. As a result, a semiconductor device having good electrical properties can be produced with a high manufacturing yield.

Second embodiment

In the present embodiment, correction of the design pattern is carried out similar to the first embodiment except the following means is used as the simulation means 10 shown in FIG. 1 performing step S12 shown in FIG. 2.

The simulation means 10 used in the present embodiment is not a procedure which simply finds the two-dimensional light intensity distribution and calculates the lines of the light intensity distribution of the predetermined threshold value or more as the transfer image based on the exposure conditions and the design pattern.

As shown in FIG. 2, in the present embodiment, the data concerning the design pattern and the transfer conditions is simulated by the light intensity simulation (step S20), and the two-dimensional light intensity distribution on the substrate such as a semiconductor wafer is found at step S21. Note that, it is also possible to find the light intensity distribution by using an actual light intensity measuring device.

After the two-dimensional light intensity distribution is found, at step S22, the latent image formation intensity is calculated and the latent image formation intensity distribution is found at step S23.

Below, a detailed explanation will be made of the processing in the calculation of the latent image formation intensity.

In the calculation of the latent image formation intensity, for example, the latent image formation intensity $M_j0$ at the point $j_0$ on the wafer plane shown in FIG. 5 is determined considering the influence of the light intensities at the point $j_0$ and a point $j_n$ (n is an integer satisfying $0 \leq n \leq 24$) which is a point positioned at the periphery of the point $j_0$. Here, the influence $M_{j0jn}$ of the light intensity at the point $j_n$ is defined in the following equation (1).

$$M_{j0jn} = f(r_n) * g(I(j_n)) \tag{1}$$

In the above Equation (1), $r_n$ indicates a distance between the point $j_0$ and the point $j_n$, and $f(r_n)$ is indicated by the following Equation (2).

$$f(r_n) = K * \exp(-r_n^2/\alpha^2) \tag{2}$$

Note, in Equation (2), the following Equation (3) is satisfied. Namely, Equation (2) is defined by using a Gaussian function.

$$\iint_{-\infty}^{\infty} K * \exp(-rn^2/\alpha^2) dx dy \tag{3}$$

Also, in Equation (1), $g(I(j_n))$ is defined by the following Equation (4).

$$g(I(j_n)) = I(j_n) \tag{4}$$

Namely, the influence $M_{j0jn}$ of the light intensity at the point $j_n$ is a value obtained by multiplying the distance $r_n$ between the point $j_0$ and the point $j_n$ by the light intensity $I(j_n)$ at the point $j_n$.

In the calculation of the latent image formation intensity, for example, in the case shown in FIG. 5, the latent image formation intensity $M_j0$ is found by cumulatively adding the influence $M_{j0\ jn}$ of the light intensity at the point $j_n$ with respect to the exposure energy at the point $j_0$.

At this time, when the size of the wafer is infinite in the two-dimensional direction and the influence of the light intensities from the infinite number of $j_n$ ($-\infty \leq n \leq \infty$) points arranged at the predetermined pattern is taken into account in accordance with this, $M_{j0}$ is indicated by the following Equation (5).

$$M_{j0} = \iint_{-\infty}^{\infty} M_{j0jn} dx dy = \iint_{-\infty}^{\infty} f(rn) * g(1(jn)) dx dy \tag{5}$$

Here, when inserting Equations (2) and (4) in Equation (5), $M_{j0}$ is defined by Equation (6).

$$M_{j0} = \iint_{-\infty}^{\infty} k * \exp(-rn^2/\alpha^2) * I(j) dx dy \tag{6}$$

In the calculation of the latent image formation intensity, $M_{j0}$ at the points arranged at a predetermined pattern on the two-dimensional plane on the wafer is calculated by the above method, and the latent image formation intensity distribution on the two-dimensional plane is found based on the results of the calculation.

Figure 4:
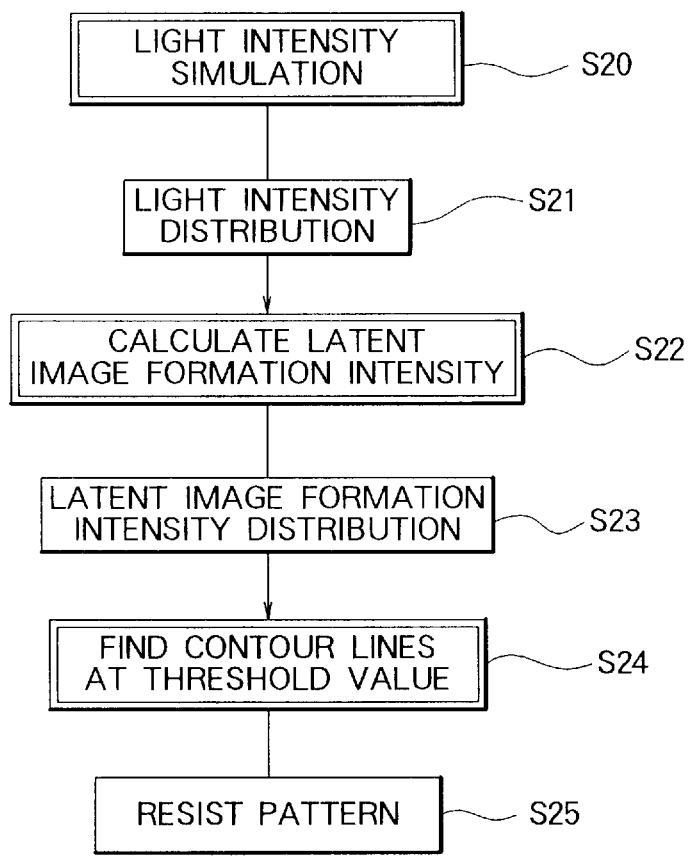
FIG. 4 is a flow chart showing the procedure for performing calculation (simulation) of the transfer resist pattern.

Next, in the latent image formation intensity distribution found by the above method, the contour lines with which the latent image formation intensity becomes the threshold value are found at step S24 shown in FIG. 4, and the pattern defined by the contour lines is used as the resist pattern at step S25. At this time, the threshold value is determined in accordance with for example the amount of exposure and the development conditions.

One example of the optimum threshold value $E_{th}$ to be used in the simulation and the constant $\alpha$ is shown next.

Figure 6:
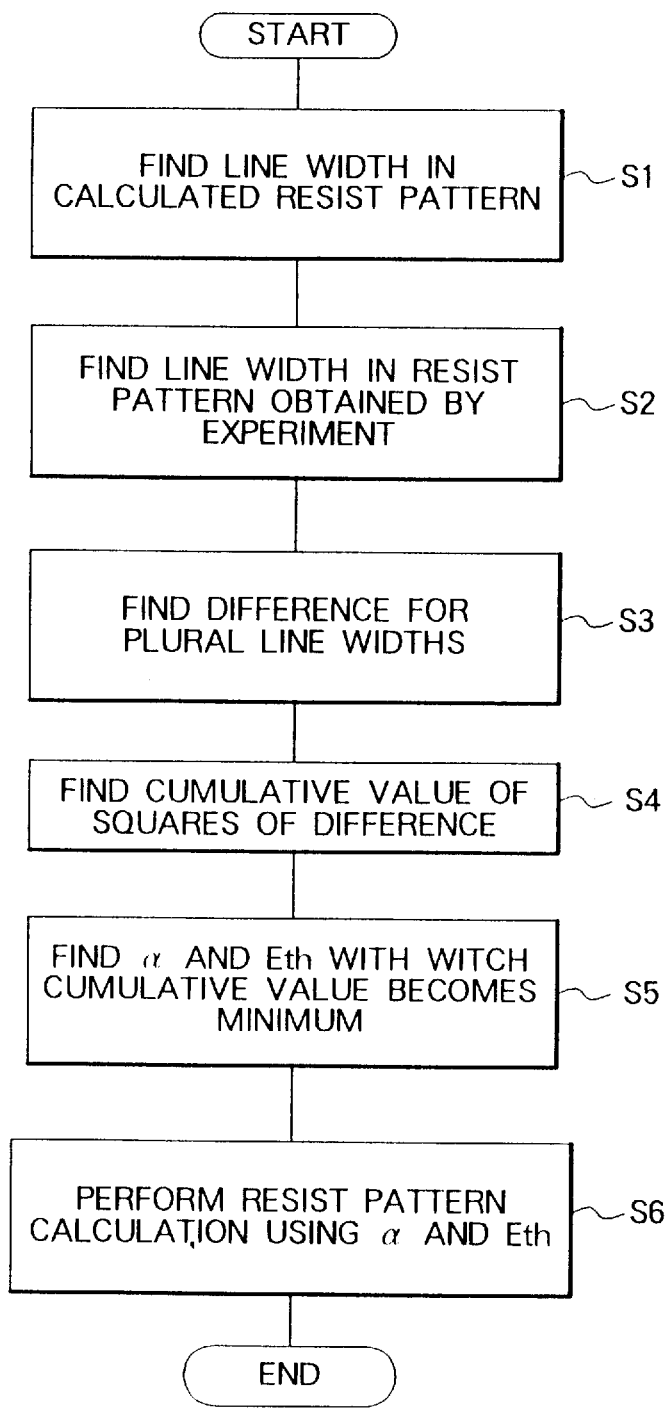
FIG. 6 is a flow chart showing one example of a method of finding a threshold value $E_{th}$ and a constant $\alpha$ used for the calculation of the latent image formation intensity.
Figure 7A:
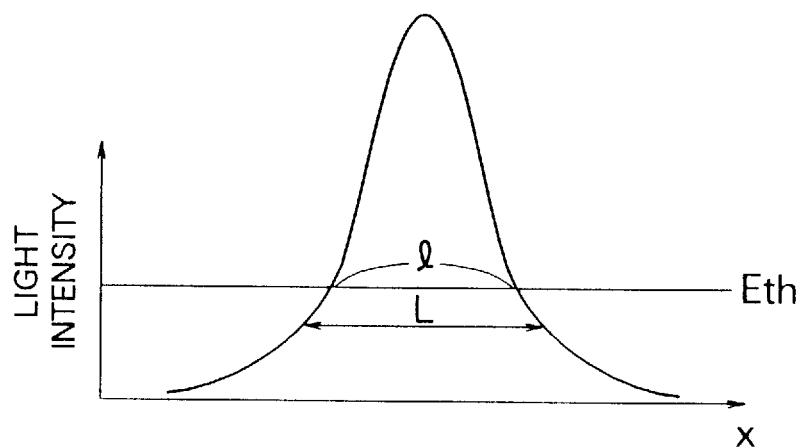
FIGS. 7A and 7B are schematic views showing that when a two-dimensional light intensity distribution is simply sliced by a threshold value, it does not always coincide with the actual pattern line width.
Figure 7B:
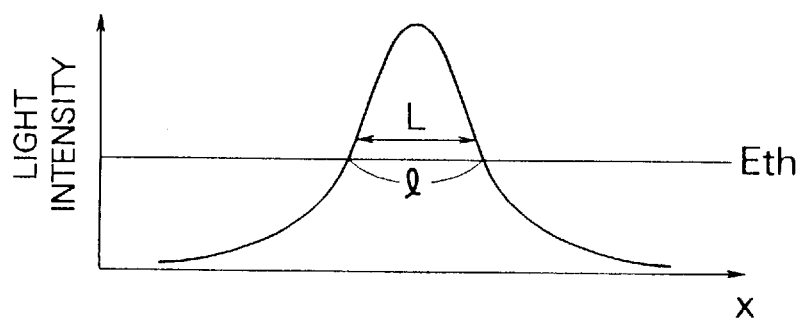

Based on various exposure times and defocus conditions, a plurality of resist patterns are calculated. The processing shown in FIG. 6 is carried out by using these calculated resist patterns.

Here, the latent image formation intensity $R(x,y)$ in the latent image formation intensity distribution is defined by for example the following Equation (7). In Equation (7), $\alpha$ is a constant.

$$R(x,y) = \iint_{-\infty}^{\infty} e^{-((x-x0)^2 + (y-y0)^2)/\alpha} * E(x0, y0) dx0 dy0 \tag{7}$$

Step S1: In the resist pattern calculated by the simulation method shown in FIG. 4, the line widths in a plurality of portions are found. At this time, the line covered is made to have a wide range of line widths.

Step S2: A transfer experiment is carried out by using the same mask pattern and exposure conditions as those of this simulation method, and the line width of the line corresponding to the line which was covered at step S1 is found.

Step S3: The difference of the line widths of a plurality of lines found at steps S1 and 2 is found by the resist pattern calculation method and the transfer experiment.

Step S4: A square value of the difference found at step S3 is found, and this square value is cumulatively added for a plurality of lines to find a cumulatively added value.

Step S5: A constant $\alpha$ and threshold value $E_{th}$ which minimize the cumulatively added value found at step S4 are calculated. At this time, the constant $\alpha$ and the threshold value $E_{th}$ are determined by performing for example the simulation shown in FIG. 4 and the processing of steps S1 to 4 of FIG. 6 using a predetermined constant $\alpha$ and threshold value $E_{th}$ as initial values, comparing the cumulatively added value at step S4 shown in FIG. 6 in the previous processing and the cumulatively added value of step S4 in this processing, and determining the constant $\alpha$ and the threshold value $E_{th}$ to be used for the processing performed next so as to reduce the difference of these cumulatively added values. Then, using this constant $\alpha$ and the threshold value $E_{th}$, the simulation of FIG. 4 and the processings of steps S1 to 4 of FIG. 6 are carried out again. These procedures are repeated to find the constant $\alpha$ and threshold value $E_{th}$ when the difference of cumulatively added values becomes the minimum.

Step S6: The simulation shown in FIG. 4 is carried out by using Equation (7) in which the constant $\alpha$ and the $E_{th}$ were determined as the values calculated at step S5.

According to the method shown in FIG. 6, the constant $\alpha$ and the $E_{th}$ in Equation (7) when performing the simulation of FIG. 4 can be adequately set. For this reason, the accuracy of the simulation shown in FIG. 4 can be further improved.

Note that, in the second embodiment, it is also possible to calculate the constant $\alpha$ and the $E_{th}$ so that the maximum value of the differences of the line width between the resist pattern obtained by the resist pattern calculation method and the resist pattern found by the experiment for the line widths at a plurality of corresponding positions becomes the minimum.

Also, in the present embodiment, a case where a Gaussian function was used in Equations (2) and (3) used in the calculation of the latent image formation intensity (step S22 shown in FIG. 4) was exemplified, but this function is not particularly limited so far as it is a function that becomes a maximum when the distance $r_n$ is 0 and becomes 0 when the distance $r_n$ is infinite.

Further, in the present embodiment, in the calculation of the latent image formation intensity of step S22 shown in FIG. 4, the latent image formation intensity was defined by using the product of the light intensity and distance, but it is also possible to define the latent image formation intensity by the product of a power of the light intensity and the distance.

In this case, the latent image formation intensity $M_{j0}$ is defined by for example the following Equation (8).

$$M(j0) = \iint_{-\infty}^{\infty} K * \exp(-rn^2/\alpha^2) * I(j)^2 dx dy \tag{8}$$

Also, in the present embodiment, a case where the exposure was carried out by using i-rays was explained, but the present invention can also be applied to a case where the pattern formation is carried out using for example an X-ray or electron beam (EB).

In the present embodiment, the latent image formation intensity distribution used when finding the resist pattern is determined by considering the influence not only by the light intensity of the arbitrary point, not only by the light intensity of the arbitrary point, but also by the light intensities of the peripheral points, so a more concrete calculation of the resist pattern (transfer image) can be carried out.

Next, it is shown that a result near the actual transfer resist pattern is obtained by performing the simulation shown in FIG. 4.

In this example, the constant α in Equation (6) was set to 0.131 and $E_{th}$ was set to 197.01.

Also, in this example, in an L/S transfer experiment, exposure was actually carried out for a positive resist for i-rays of a Company A using an i-ray having a wavelength of 365 nm and under exposure conditions of an NA of 0.50 and a σ of 0.68 while changing the defocus and exposure time.

Figures 8A, 8B:
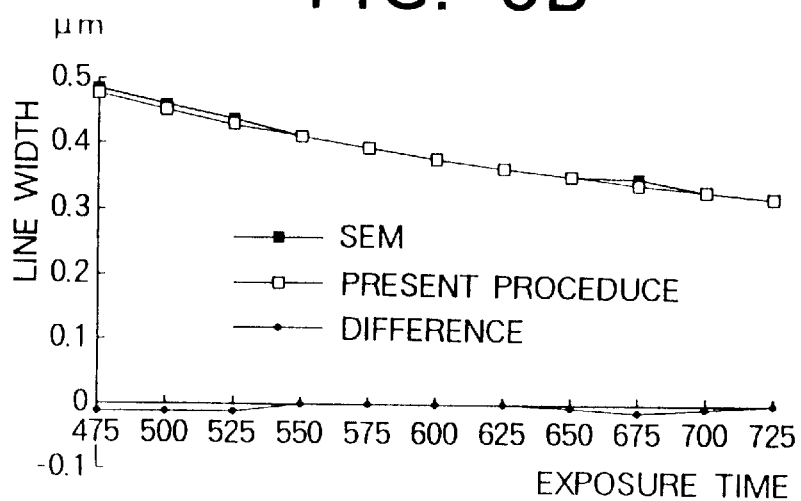
FIG. 8A is a correspondence table of a line width (SEM) found in an L/S transfer experiment at different defocus and exposure times, a line width (present procedure) found by using the simulation method according to the embodiment, and a difference between the line width (present procedure) and the line width (SEM)
FIG. 8B is a graph in which the line width (present procedure) and line width (SEM) shown in A are plotted on an ordinate and an exposure time is plotted on an abscissa.

FIG. 8A shows a correspondence table of a line width (SEM) found in the L/S transfer experiment in the respective defocus states and exposure times, a line width (present procedure) found by using the method of calculation of a resist pattern of this example, and a difference between the line width (present procedure) and the line width (SEM).

FIG. 8B is a graph in which the line width (present procedure) and line width (SEM) shown in FIG. 8A are plotted on an ordinate and an exposure time is plotted on an abscissa.

From the results of the experiment shown in FIG. 8A, 3σ became equal to 0.0153 in the present example.

Contrary to this, a resist pattern was prepared by using the conventional method of calculation of a resist pattern not using the calculation of the latent image formation intensity. At this time, when finding the resist pattern from the light intensity distribution, the threshold value $E_{th}$ was set to 193.54.

Also, in the comparative example, in the L/S transfer experiment, exposure was actually carried out on a positive resist for i-rays of a Company A using an i-ray having a wavelength of 365 nm and under exposure conditions of an NA of 0.50 and a σ of 0.68 while changing the defocus and exposure time.

Figures 9A, 9B:
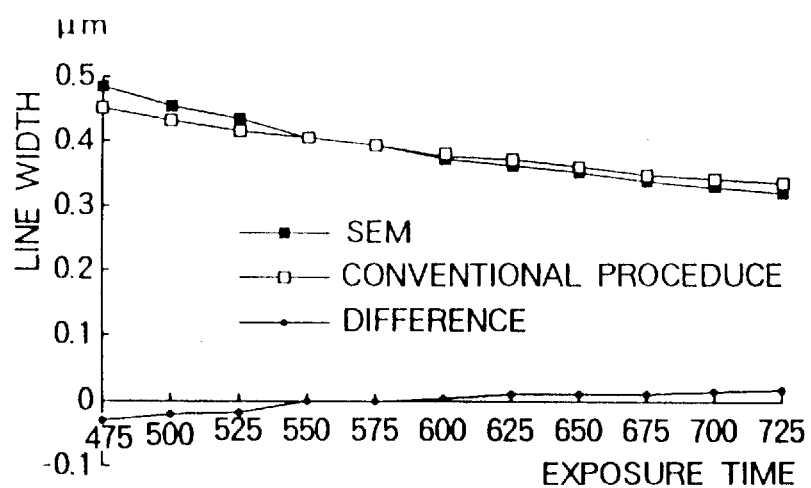
FIG. 9A is a correspondence table of the line width (SEM) found in the L/S transfer experiment at different defocus and exposure times, a line width (conventional procedure) found by using the simulation method according to the comparative example, and a difference between the line width (conventional procedure) and the line width (SEM)
FIG. 9B is a graph in which the line width (conventional procedure) and line width (SEM) shown in (A) are plotted on the ordinate and the exposure time is plotted on an abscissa.

FIG. 9A shows a correspondence table of the line width (SEM) found in the L/S transfer experiment in the respective defocus states and exposure times, a line width (conventional procedure) found by using the resist pattern calculation method of the comparative example, and a difference between the line width (conventional procedure) and the line width (SEM).

FIG. 9B is a graph in which the line width (conventional procedure) and line width (SEM) shown in FIG. 9A are plotted on the ordinate and the exposure time is plotted on an abscissa.

From the results of the experiment shown in FIG. 9A, 3σ became equal to 0.0313 in the present comparative example.

When comparing the results shown in FIG. 8 (present example) and the results shown in FIG. 9 (comparative example), it was confirmed that 3σ according to the present example was about ½ of that of the comparative example, and the precision of the simulation shown in FIG. 4 was good.

Third embodiment

In the present embodiment, at step S11 shown in FIG. 2 to be performed by the evaluation point arrangement means 8 shown in FIG. 1, the design pattern is corrected similar to the first embodiment or second embodiment except the target points are set at other than the evaluation points.

Below, an explanation will be made only of portions different from the above embodiments.

Figure 10:
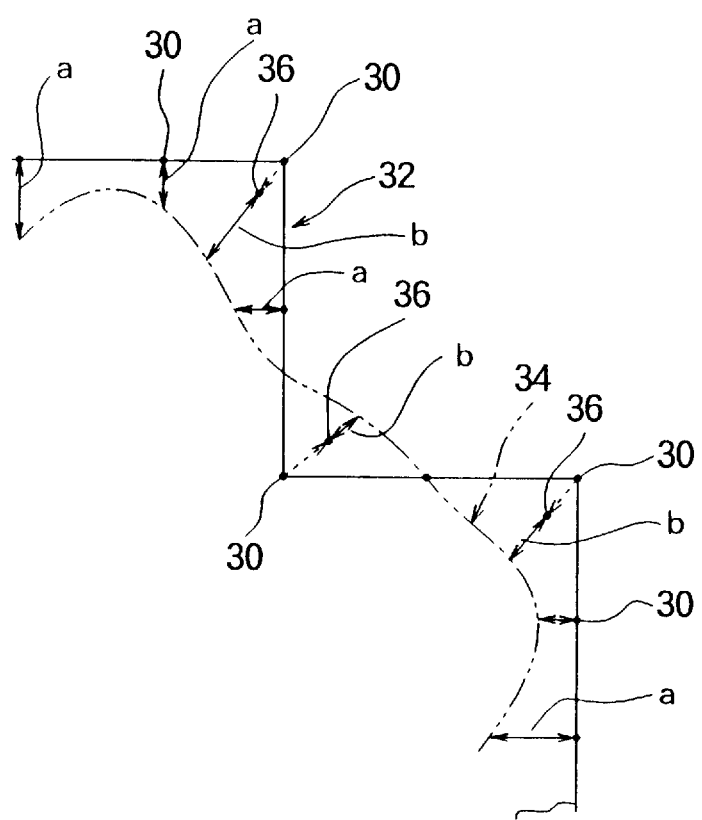
FIG. 10 is a schematic view of the method of setting target points according to the embodiment.

In the present embodiment, as shown in FIG. 10, target points 36 are determined corresponding to the evaluation points 30 positioned at the convex corners or the concave corners of the design pattern 32, the target points 36 are determined inside the corner (for example −0.08 μm) at the convex corners, and the target points 36 are determined outside of the corner (for example +0.08 μm) at the concave corners.

In the present embodiment, in the comparison step of step S13 shown in FIG. 2, at the positions where only the evaluation points 30 are set, a difference a between the simulated transfer image 34 and the design pattern 32 is compared for every evaluation point 30. At the position where the target points 36 are set, a difference b between the target point 36 and the transfer image 34 is compared. Then, in the deformation step of step S14 shown in FIG. 2, the design pattern 32 is deformed by using the evaluation point 30 (not the target point) as the reference according to the differences a and b compared for every evaluation point 30 or every target point 36 so that the difference becomes small.

For example, in the convex corner or concave corner of the design pattern 32, where the evaluation point 30 is positioned on these corners, if the correction of the mask pattern is carried out for the purpose of making the transfer image approach the evaluation point 30 per se, there is a concern that the transfer image at the positions other than the corner will become more different from the design pattern 32.

In the method of correction of a mask pattern according to the present embodiment, for example the target points 36 are determined inside the corner at the convex corners, the target points 36 are determined outside the corner at the concave corners, and the correction is applied to the design pattern 32 so that the transfer image 34 approaches these target points 36 so that the transfer image 34 can be made to approach the design pattern well as a whole. As a result, the bridges, disconnections, etc. between parts of the pattern can be prevented well.

Fourth embodiment

In the present embodiment, the design pattern is corrected similar to the first embodiment, second embodiment, or third embodiment except the simulation is performed at step S12 shown in FIG. 2 by using the simulation means 10 shown in FIG. 1 under a plurality of types of transfer conditions.

Below, an explanation will be made of only the portions different from the above embodiments.

Namely, in the present embodiment, in the simulation step, transfer images are simulating the plurality of types of transfer conditions based on the combination of the plurality of amounts of exposure of the preliminarily set margin of exposure and the plurality of focal positions within the range of the preliminarily set depth of focus so as to obtain a plurality of transfer images. Then, in the comparison step of step S13 shown in FIG. 2, the difference of each of the plurality of transfer images from the design pattern is compared for every evaluation point and a plurality of types of differences are calculated for every evaluation point. Then, in the deformation step of step S14 shown in FIG. 2, the design pattern is deformed so that the plurality of types of differences for every evaluation point becomes smaller by a predetermined reference.

The predetermined reference in the deformation step is a reference such that for example the mean value of the plurality of types of differences for every evaluation point becomes the minimum.

Also, as another predetermined reference, a reference such that the difference between the maximum difference and minimum difference among the plurality of types of differences for every evaluation point becomes the minimum may be mentioned.

Further, as still another predetermined reference, a reference such that the square average of the plurality of types of differences for every evaluation point becomes the minimum may be mentioned.

By the method of correction of the mask pattern according to the present embodiment, a transfer image where the transfer condition changes within the range of the processing margin is considered (processing margin is considered), so the processing margin, that is, the margin of exposure and depth of focus, is no longer reduced based on the corrected mask pattern. As a result, if photolithography is carried out by using the photomask of this mask pattern, the manufacturing yield is improved.

Fifth embodiment

The present embodiment is one where the method of the present invention is applied to a case where a pattern of a polycrystalline silicon layer of a memory device of a 0.4 μm rule is exposed and transferred to a positive Novolak-based resist under conditions of an exposure wavelength of 365 nm, NA=0.50, and σ=0.68. In the present embodiment, matters which are not particularly disclosed are similar to those of the above embodiments.

FIG. 11 shows a design pattern 32 applied in the present embodiment.

First, as shown in FIG. 12, the evaluation points 30 were provided at all corners and all sides of the design pattern with a pitch of 0.2 μm.

Figure 13:
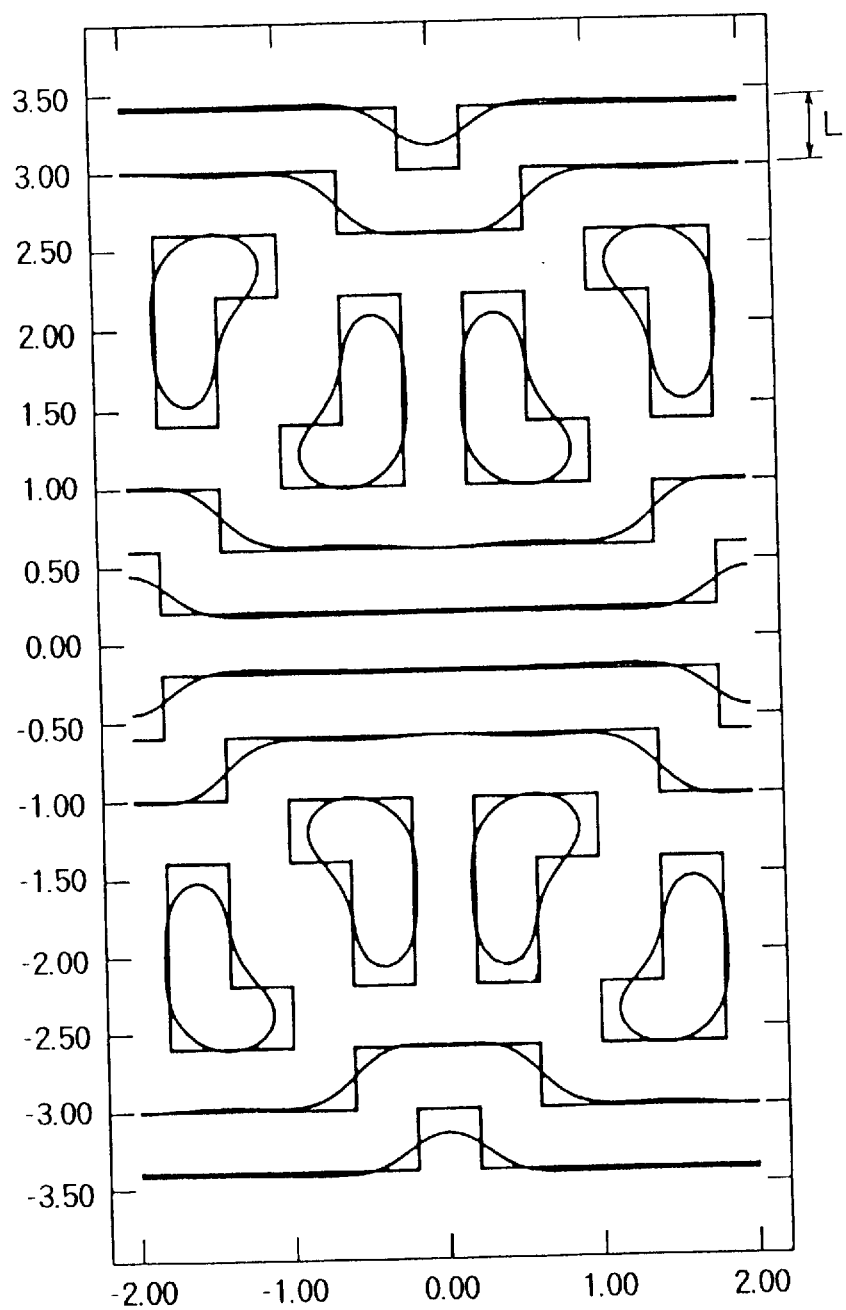
FIG. 13 is a plan view of the pattern showing the simulation result at just focus.

Next, a light intensity distribution obtained where a mask having this design pattern as it was was transferred at a focused state was found. Convolution integration was carried out according to the equation obtained by assigning α=0.22 in Equation (7) and the contour lines obtained by slicing this integration value by the threshold value $E_{th}$ were found as a resist image (transfer image). The result is shown in FIG. 13. Note that, the threshold value $E_{th}$ was determined so that the line width L in FIG. 13 became 0.4 μm.

Figure 14:
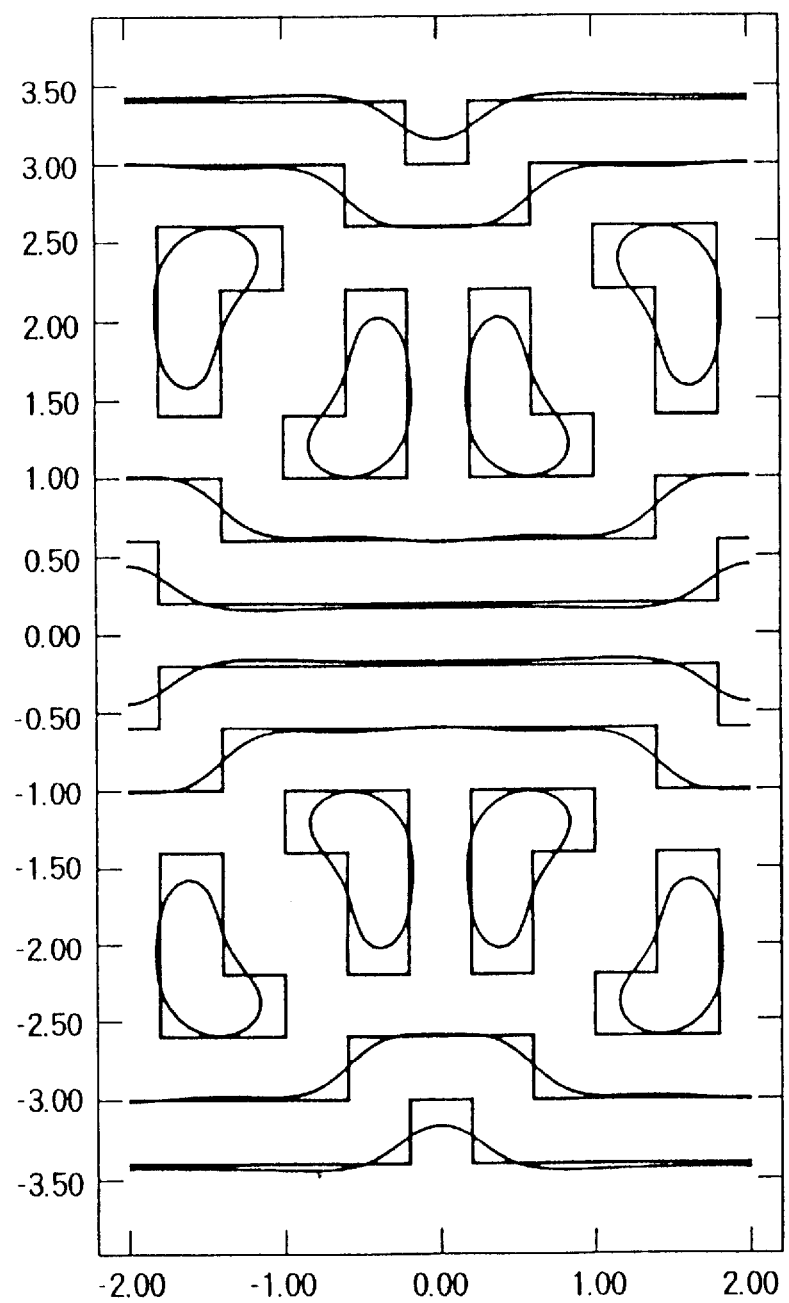
FIG. 14 is a plan view of the pattern showing the simulation result at a defocused state.

Further, the depth of focus required in the photolithographic step was defined as ±0.75 μm, the convolution integration of the light intensity distribution and the Gaussian function in the case of a 0.75 82 m defocus was found, and the contour lines sliced by the threshold value $E_{th}$ were found. The results are shown in FIG. 14.

Also, the margin of exposure required in the photolithographic step was set to ±10%, and in the two convolution integrations, the contour lines sliced at a height $E_{th}^-$ obtained by decreasing the threshold value $E_{th}$ by 10% were found as the resist image where the exposure amount was increased by +10%, and contour lines sliced at a height $E_{th}^+$ obtained by increasing the threshold value $E_{th}$ by 10% were found as the resist image where the exposure amount was decreased by 10%, respectively.

By this, six types of resist images in total obtained by multiplying two types of the focal positions, i.e., a focused state and a defocused state of 0.75 μm, by three types of exposure amounts, i.e., the optimum exposure amount, 10% overdose exposure, and 10% underdose exposure, were found by the simulation means 10 shown in FIG. 1.

Subsequently, in all of the evaluation points, an amount of deviation (difference) was found by the procedure shown in FIG. 3A or FIG. 10 with respect to the pattern boundary (edge) of six types of resist images.

Next, the mean value of the amount of deviation of six types of edges for every evaluation point found in this way was found. Note, in the present embodiment, as shown in FIG. 10, the target points 36 were set at the evaluation points 30 of the corners of the design pattern 32. As shown in FIG. 10, the target points 36 are set corresponding to the evaluation points 30 positioned in the convex corners or concave corners of the design pattern 32, the target points 36 were determined inside the corners (−0.08 μm) at the convex corners, and the target points 36 were determined outside (+0.08 μm) of the corners at the concave corners.

In the present embodiment, in the comparison step of step S13 shown in FIG. 2, at the positions where only the evaluation points 30 are set, the difference a between the simulated transfer image 34 and the design pattern 32 (refer to FIG. 10) is compared for every evaluation point 30. At the positions where the target points 36 are set, the difference b between the target points 36 and the transfer image 34 (refer to FIG. 10) is compared.

In the deformation step of step S14 shown in FIG. 2, the design pattern 32 is deformed using the evaluation point 30 (not the target point) as the reference according to the differences a and b compared for every evaluation point 30 or every target point 36 so that the difference becomes small. In the present embodiment, the mask pattern edge in the vicinity of each evaluation point was moved in the reverse direction with respect to the mean value of the amount of deviation of the obtained edge by a procedure as shown in FIG. 3B. Here, the amount of movement of the pattern edge was set to the amount obtained by multiplying the mean value of the amount of deviation by 0.25.

In this way, the corrected design pattern shown in FIG. 15 was obtained.

Figure 16:
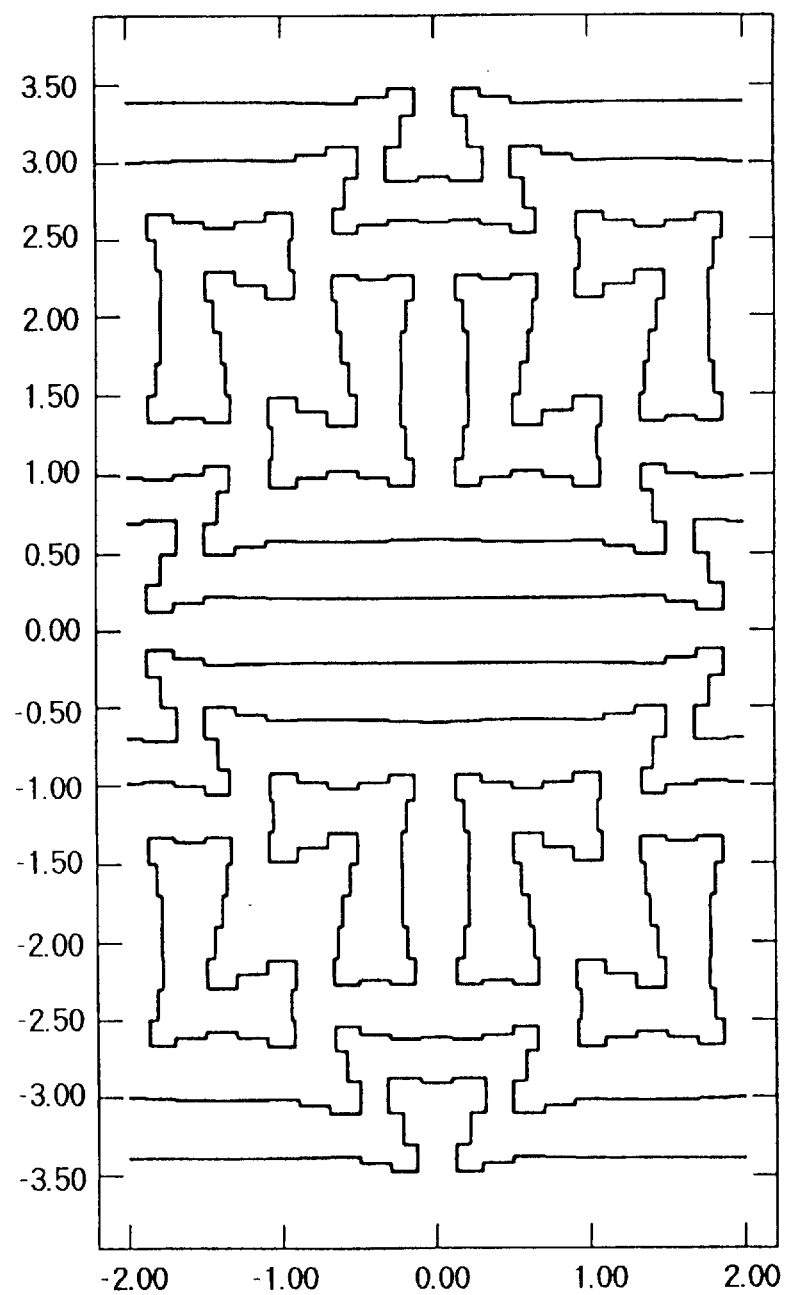
FIG. 16 is a plan view of one example of a mask pattern corrected by a plurality of repeated correction steps.

Further, in these procedures, the positions of the evaluation points and the positions of the target points were maintained as they were, steps S12 to S14 shown in FIG. 2 by the simulation means 10, comparison means 12, and the deformation means 14 shown in FIG. 1 were repeated four times by using the finished corrected pattern shown in FIG. 15 as the starting point, and a finished corrected mask pattern shown in FIG. 16 was obtained.

By this correction, it was possible to successfully reduce the 3σ, indicating the deviation of the six types of edge deviations obtained by changing the exposure conditions at the evaluation points, to 0.115 μm in the present embodiment as compared with 0.240 μm in the mask of the design pattern as it was.

Figure 17:
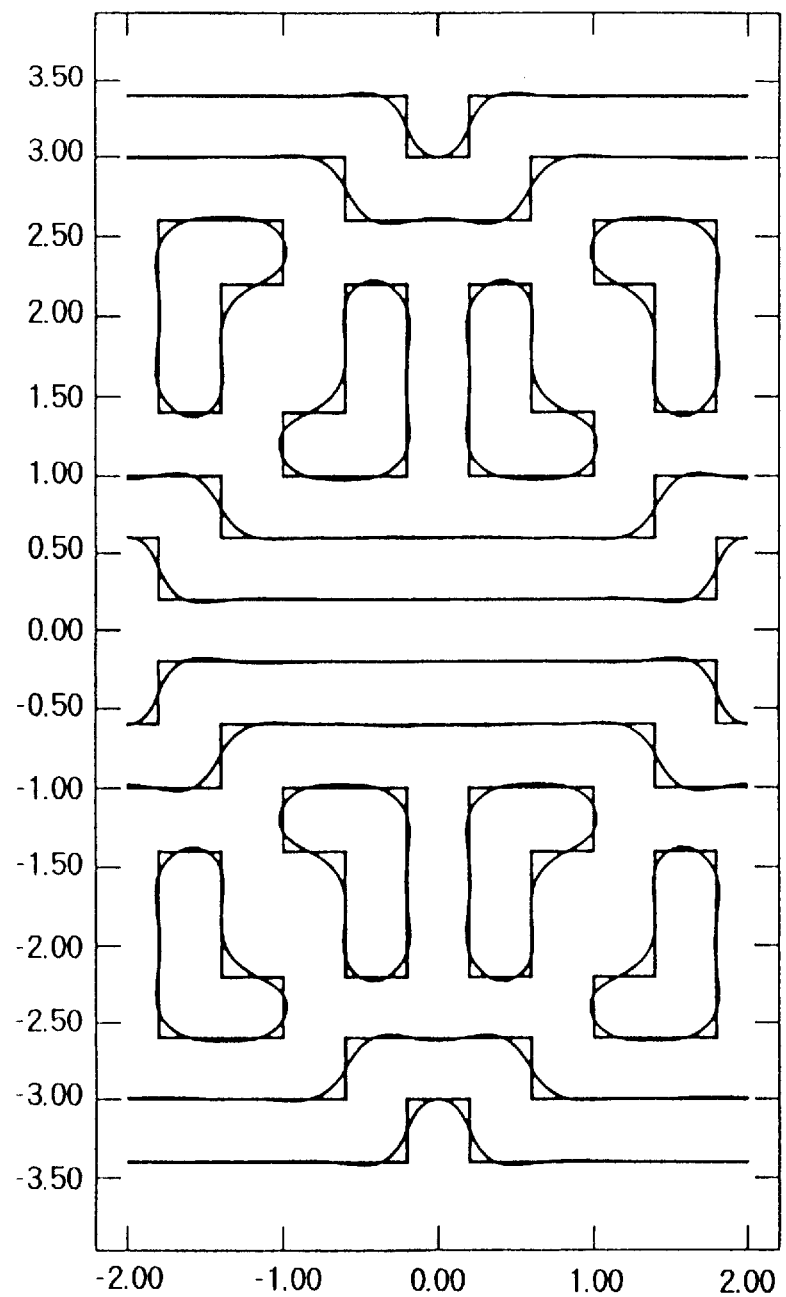
FIG. 17 is a plan view of a transfer image simulated at just focus by using the finished corrected mask pattern shown in FIG. 16.
Figure 18:
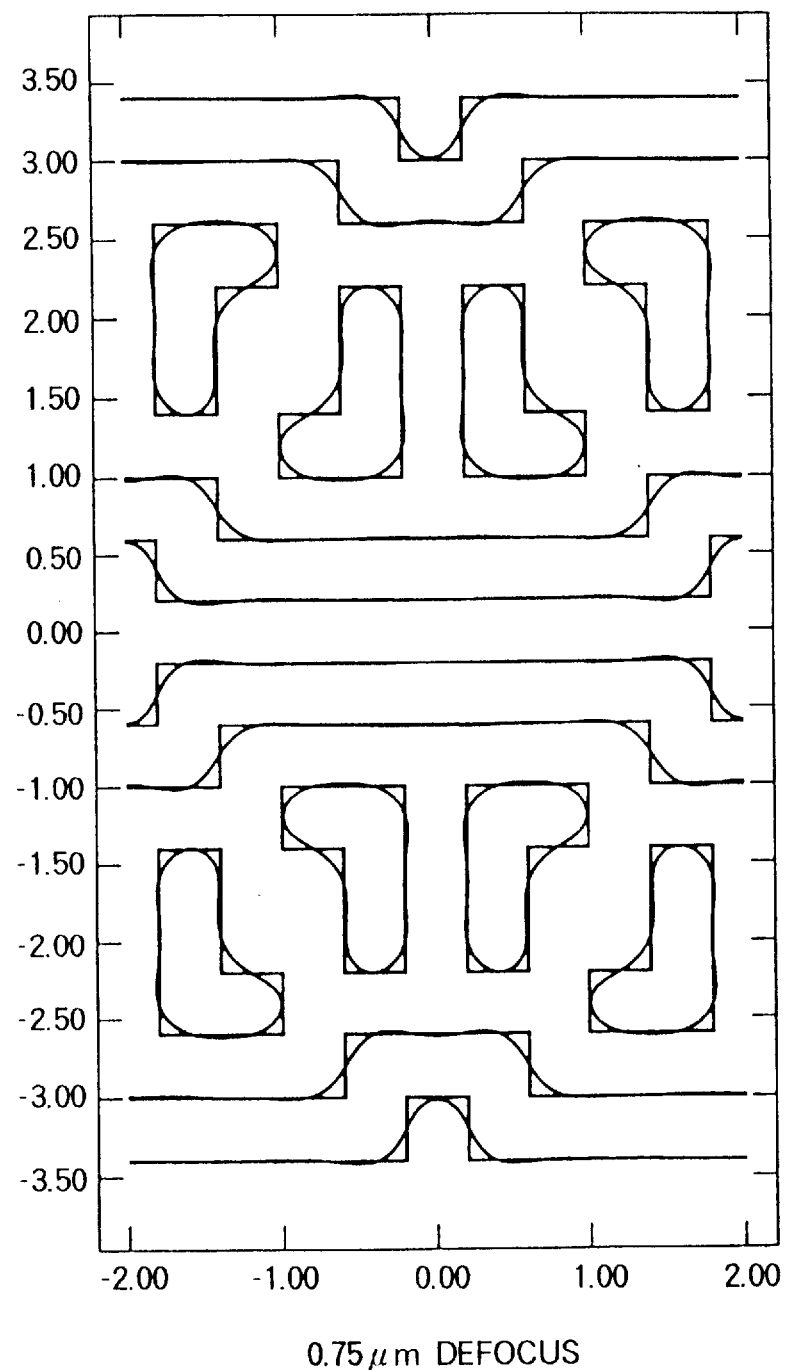
FIG. 18 is a plan view of a transfer image simulated at a defocused state by using the finished corrected mask pattern shown in FIG. 16.

Resist patterns at the focused state and at the defocused state of 0.75 μm, obtained by using the photomask having the mask pattern shown in FIG. 16, are shown in FIGS. 17 and 18, respectively. It was confirmed that a very good resist pattern was obtained in comparison with the resist pattern before correction shown in FIGS. 13 and 14.

By performing the exposure and by producing a semiconductor device using the photomask having a mask pattern corrected by the method of correction according to the present invention, a semiconductor device having good electrical properties can be produced with a high manufacturing yield.

Sixth embodiment

The present embodiment is one where the method of the present invention is applied to a case where the pattern of a LOCOS (selective silicon oxide) layer of a memory device of a 0.4 μm rule is exposed and transferred to a positive Novolak-based resist under conditions of an exposure wavelength of 365 nm, NA=0.50, and σ=0.68. In the present embodiment, matters which are not particularly disclosed are similar to those of the above embodiments.

Figure 19:
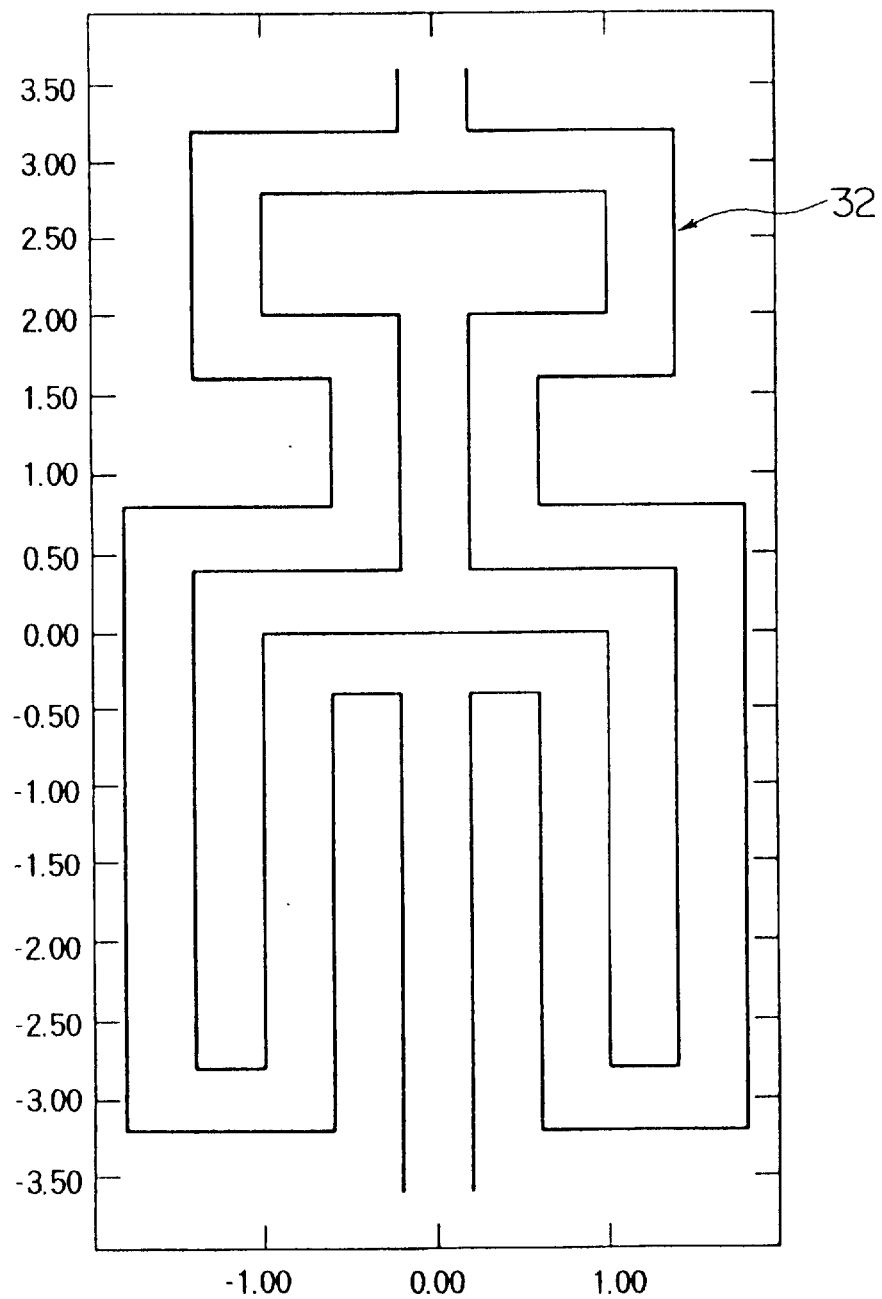
FIG. 19 is a plan view of the initial design pattern according to another embodiment.

FIG. 19 shows the design pattern 32 applied in the present embodiment.

Figure 20:
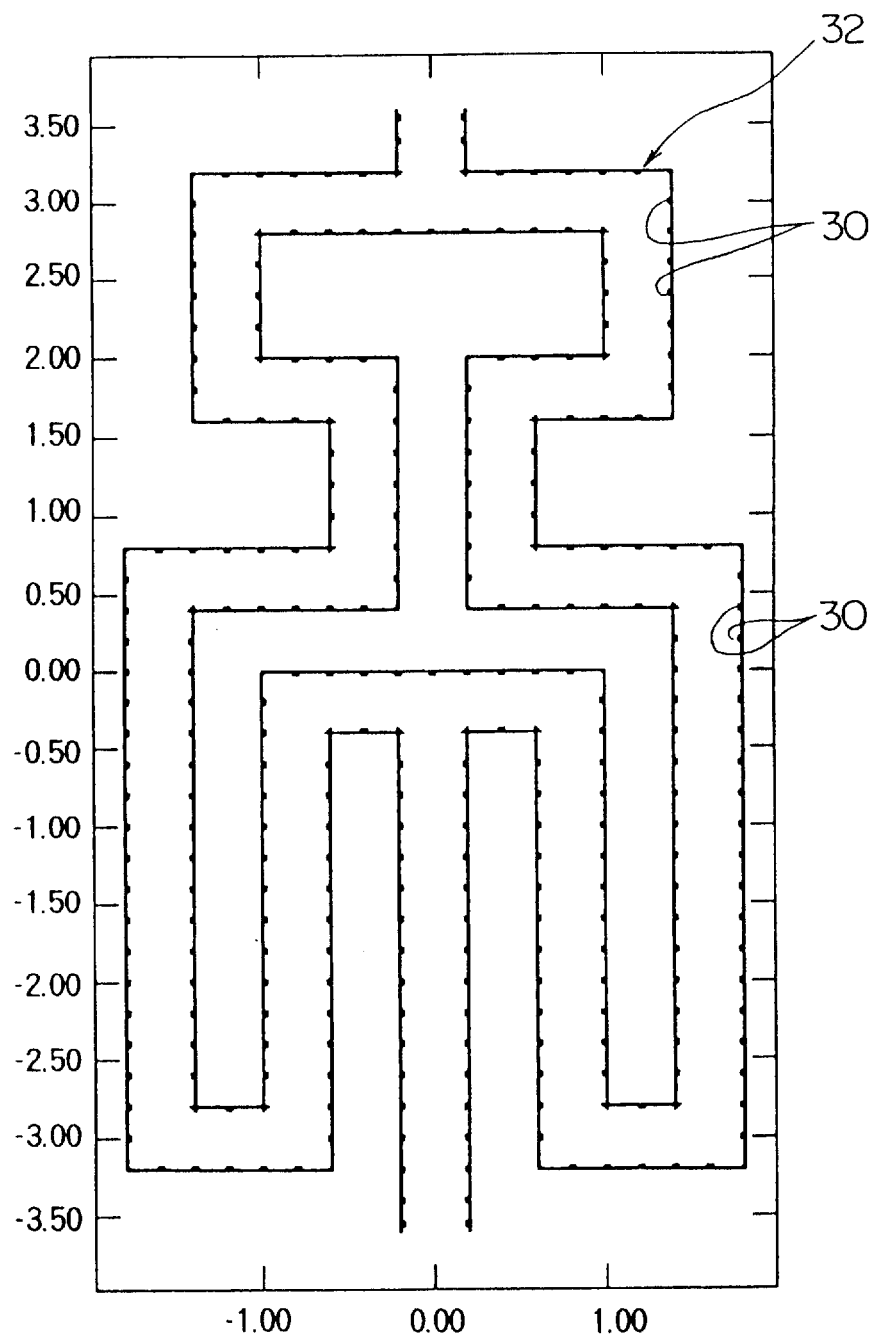
FIG. 20 is a plan view of one example of the method of arrangement of evaluation points according to another embodiment.

First, as shown in FIG. 20, evaluation points 30 were provided at all corners and all sides of the design pattern at a pitch of 0.2 μm.

Figure 21:
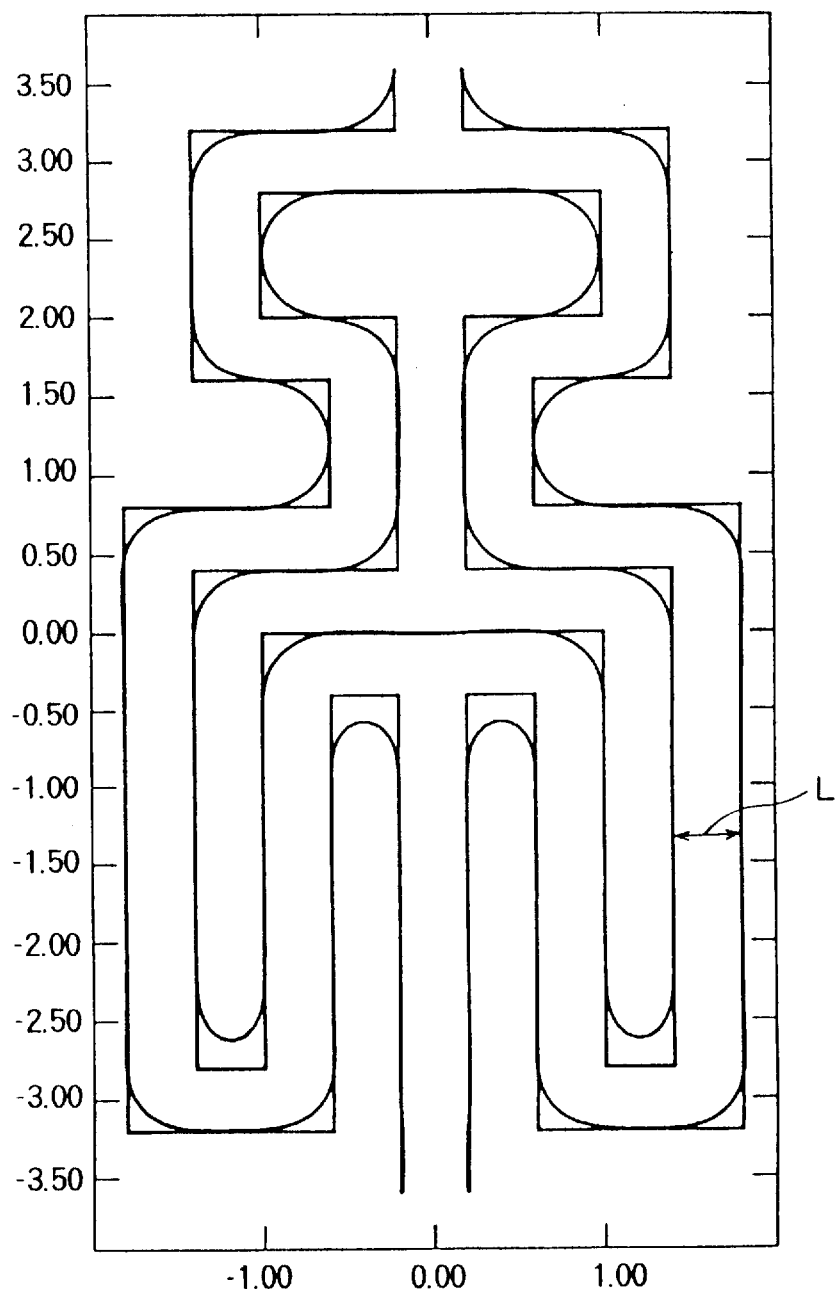
FIG. 21 is a plan view of a pattern showing the result of simulation at just focus according to another embodiment.

Next, the light intensity distribution obtained where a mask having this design pattern as it was was transferred at the focused state was found, and convolution integration was carried out according to the equation obtained by assigning α=0.22 in Equation (7). The contour lines obtained by slicing this integration value by the threshold value $E_{th}$ were found as the resist image (transfer image). The result is shown in FIG. 21. Note that, the threshold value $E_{th}$ was determined so that the line width L in FIG. 21 became 0.4 μm.

Figure 22:
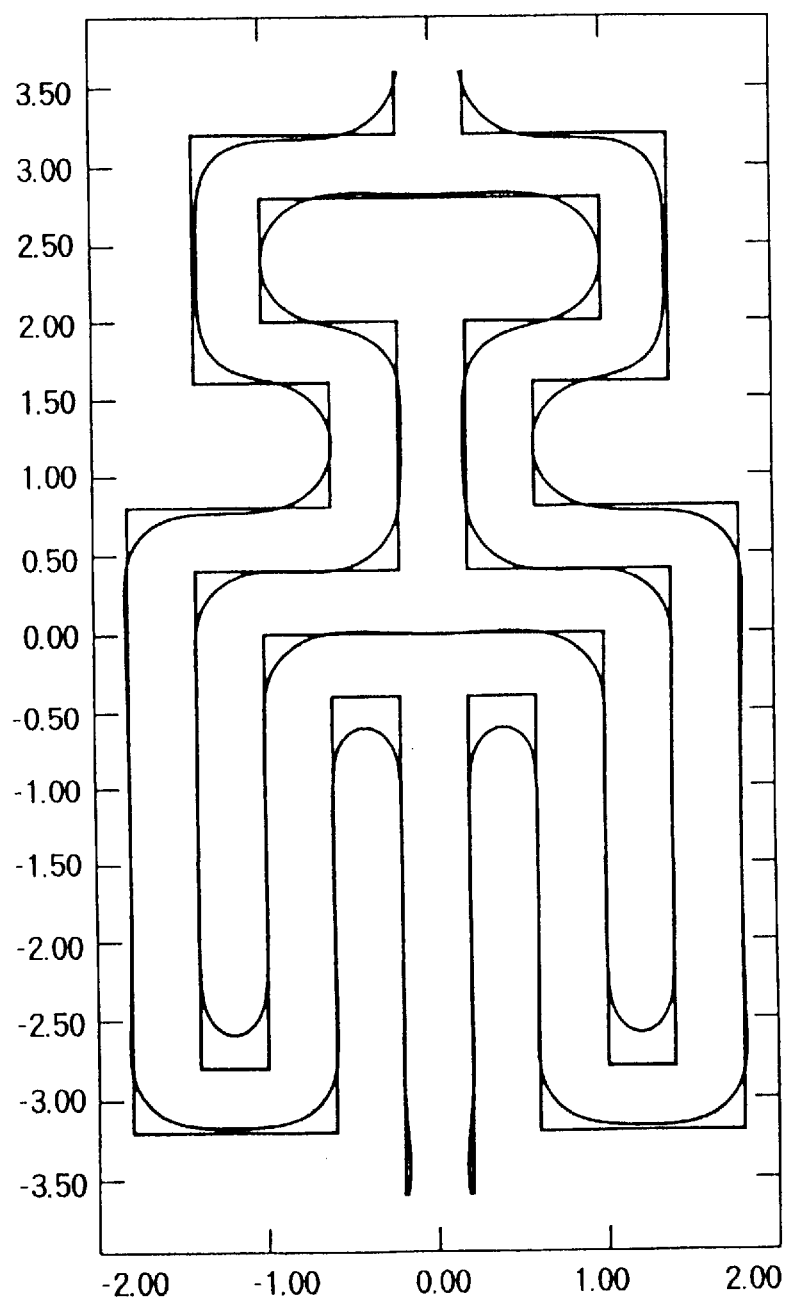
FIG. 22 is a plan view of a pattern showing the result of simulation at a defocused state according to another embodiment.

Further, the depth of focus required in the photolithographic step was defined as ±0.75 μm, a convolution integration of the light intensity distribution and a Gaussian function in the case of a 0.75 μm defocus was found, and the contour lines sliced by the threshold value $E_{th}$ were found. The results are shown in FIG. 22.

Also, the margin of exposure required in the photolithographic step was set to ±10%, and in the two convolution integrations, the contour lines sliced at the height $E_{th}^-$ obtained by decreasing the threshold value $E_{th}$ by 10% were found as the resist image where the amount of exposure was increased by +10%, and the contour lines sliced at the height $E_{th}^+$ obtained by increasing the threshold value $E_{th}$ by 10% were found as the resist image where the amount of exposure was decreased by 10%, respectively.

By this, six types of resist images in total obtained by multiplying two types of the focal positions, i.e., the focused state and the defocused state of 0.75 μm, by three types of amounts of exposure, i.e. the optimum exposure amount, 10% overdose exposure, and 10% underdose exposure, were found by the simulation means 10 shown in FIG. 1.

Subsequently, in all of the evaluation points, an amount of deviation (difference) was found by the procedure shown in FIG. 3A or FIG. 10 for the pattern boundary (edge) of six types of resist images.

Next, the mean value of the amount of deviation of six types of edges for every evaluation point found in this way was found. Note, in the present embodiment, as shown in FIG. 10, the target points 36 were set at the evaluation points 30 of the corners of the design pattern 32. As shown in FIG. 10, the target points 36 are set corresponding to the evaluation points 30 positioned at the convex corners or concave corners of the design pattern 32, the target points 36 were determined inside the corners (−0.08 μm) at the convex corners, and the target points 36 were determined outside (+0.08 μm) of the corner at the concave corners.

In the present embodiment, in the comparison step of step S13 shown in FIG. 2, at the positions where only the evaluation points 30 are set, the difference a between the simulated transfer image 34 and the design pattern 32 (refer to FIG. 10) is compared for every evaluation point 30. At the positions where the target points 36 are set, the difference b between the target point 36 and the transfer image 34 (refer to FIG. 10) is compared Then, in the deformation step of step S14 shown in FIG. 2, the design pattern 32 is deformed using the evaluation point 30 (not the target point) as the reference according to the differences a and b compared for every evaluation point 30 or every target point 36 so that the difference becomes small. In the present embodiment, the mask pattern edge in the vicinity of each evaluation point was moved in the reverse direction with respect to the mean value of the amount of deviation of the obtained edge by a procedure as shown in FIG. 3B. Here, the amount of movement of the pattern edge was set to the amount obtained by multiplying the mean value of the amount of deviation by 0.25.

Figure 23:
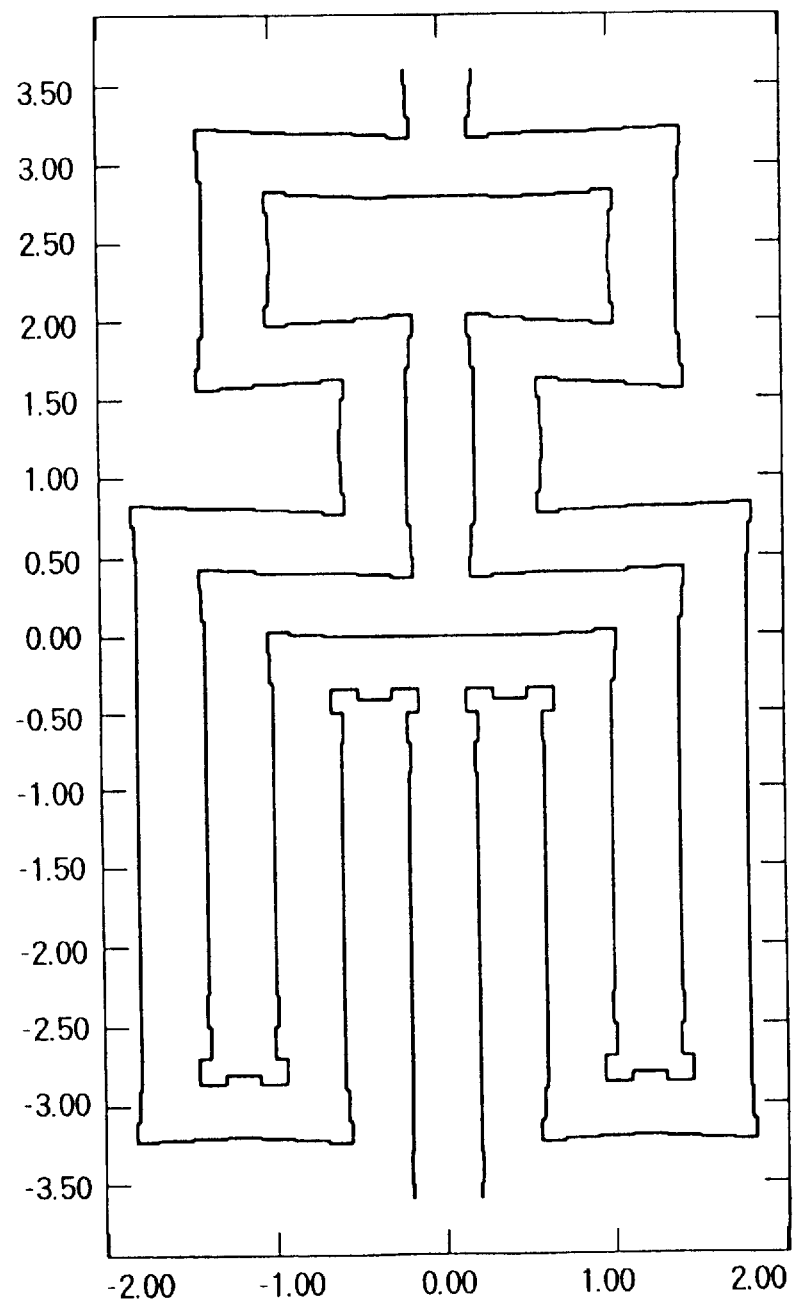
FIG. 23 is a plan view of one example of a mask pattern corrected by a single correction step according to another embodiment.

In this way, the corrected design pattern shown in FIG. 23 was obtained.

Figure 24:
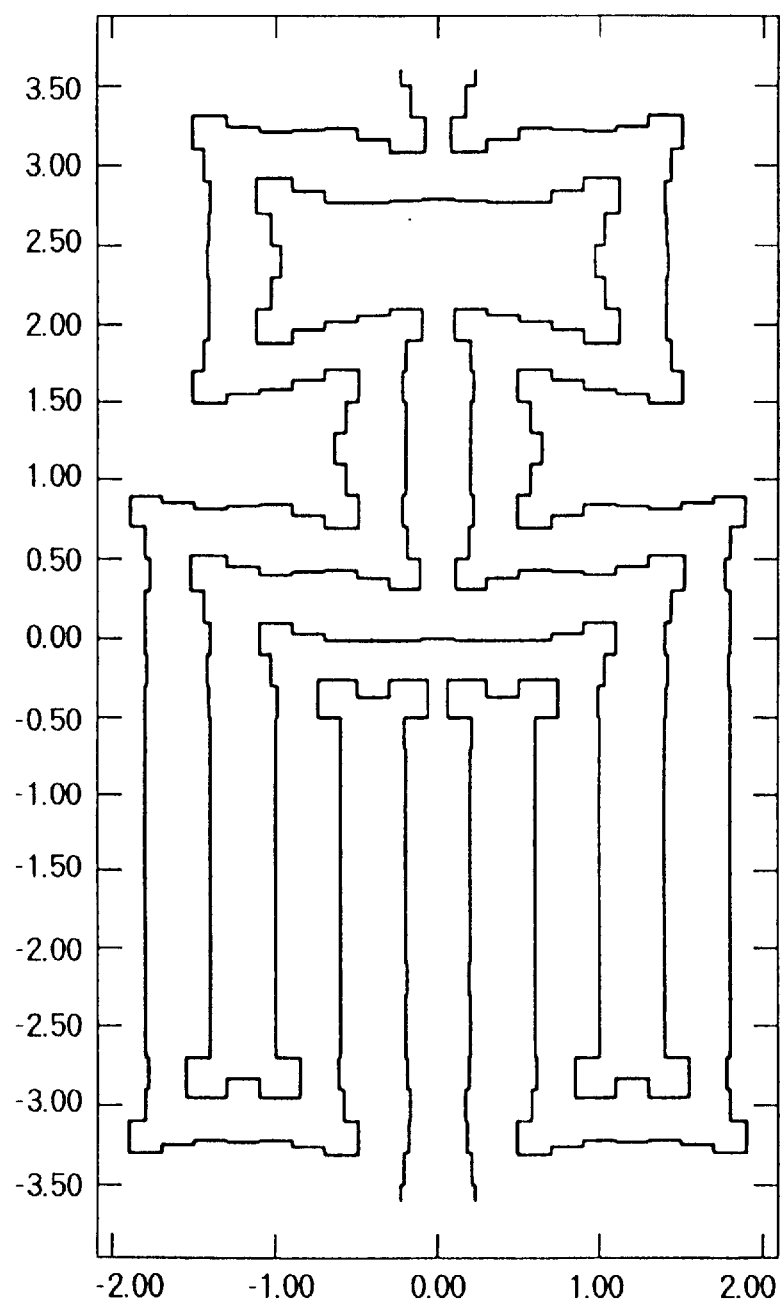
FIG. 24 is a plan view showing one example of a mask pattern corrected by a plurality of repeated correction steps according to another embodiment.

Further, in these procedures, the positions of the evaluation points and the positions of the target points were maintained as they were, steps S12 to S14 shown in FIG. 2 by the simulation means 10, comparison means 12, and the deformation means 14 shown in FIG. 1 were repeated four times using the finished corrected pattern shown in FIG. 23 as the starting point, and a finished corrected mask pattern shown in FIG. 24 was obtained.

By this correction, it was possible to successfully reduce the 3σ, indicating the deviation of the six types of edge deviation amounts obtained by changing the exposure conditions at the respective evaluation points, to 0.096 μm in the present embodiment as compared with 0.19 μm in the mask of the design pattern as it was.

Figure 25:
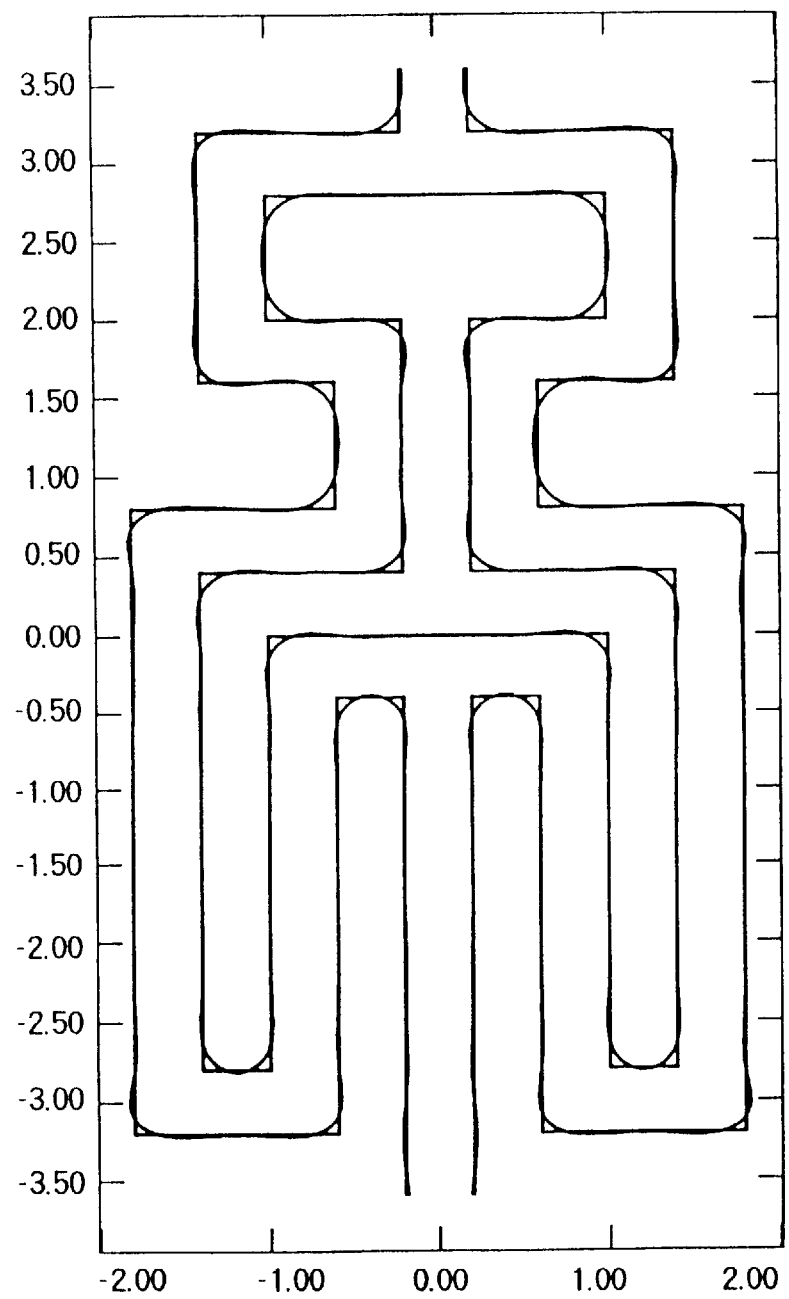
FIG. 25 is a plan view of the transfer image simulated at a focused state by using the finished corrected mask pattern shown in FIG. 24.
Figure 26:
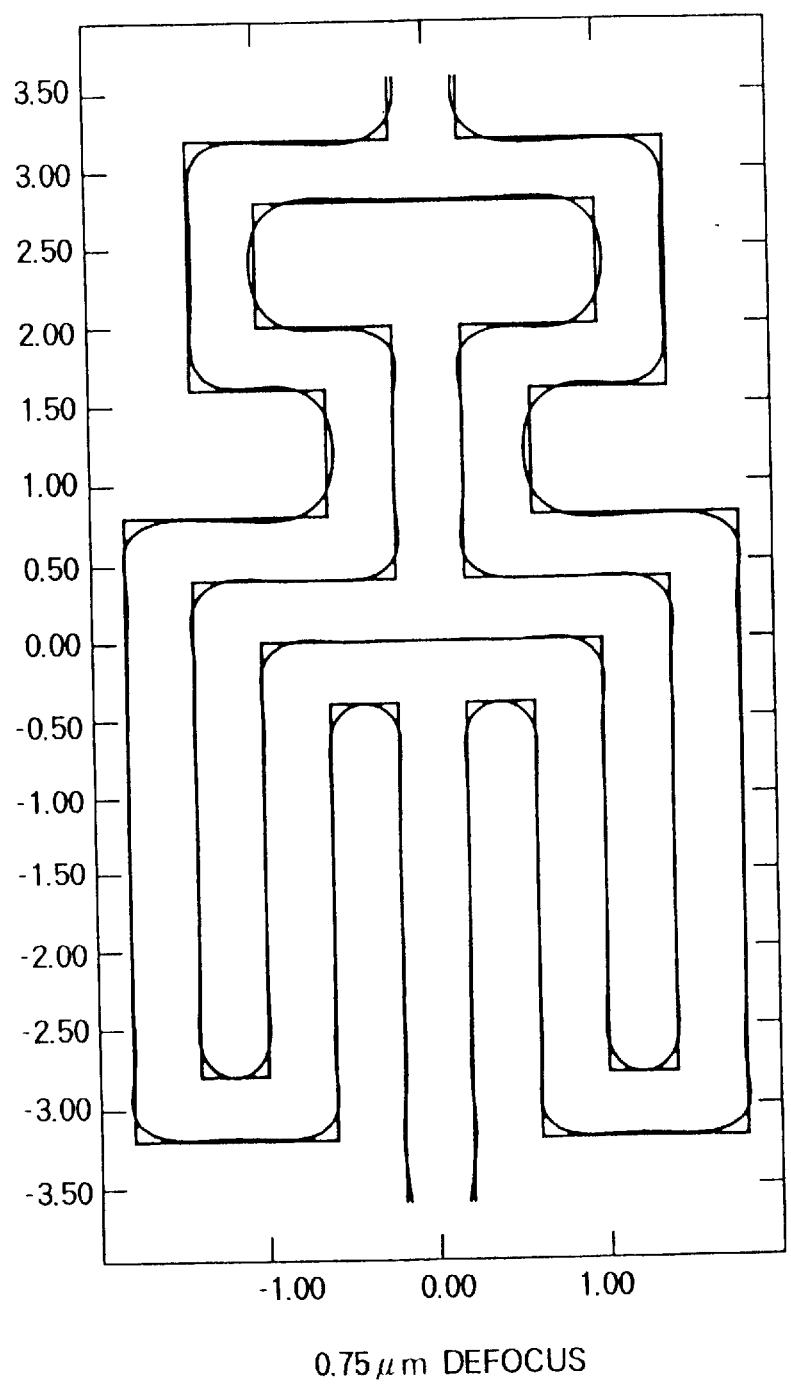
FIG. 26 is a plan view of the transfer image simulated at a defocused state by using the finished corrected mask pattern shown in FIG. 24.

Resist patterns at the focused state and at a defocused state of 0.75 μm, obtained by using the photomask having the mask pattern shown in FIG. 24, are shown in FIGS. 25 and 26, respectively. It was confirmed that a very good resist pattern was obtained in comparison with the resist pattern before correction shown in FIGS. 21 and 22.

By performing the exposure and by producing a semiconductor device by using a photomask having a mask pattern corrected by the method of correction according to the present invention, a semiconductor device having good electrical properties can be produced with a high manufacturing yield.

Seventh embodiment

The present embodiment is one where the method of the present invention is applied to a case where the pattern of a polycrystalline silicon layer of a memory device of a 0.4 μm rule is exposed and transferred to a positive Novolak-based resist under conditions of an exposure wavelength of 365 nm, NA=0.50, and σ=0.68 by using a phase shift mask of a halftone system having a semi-light blocking region with a transmittance of 8% and setting the phase difference between the transmission light of the semi-light blocking region and the transmission light of the transmission region to 180 degrees. In the present embodiment, matters which are not particularly disclosed are similar to those of the above embodiments.

Figure 27:
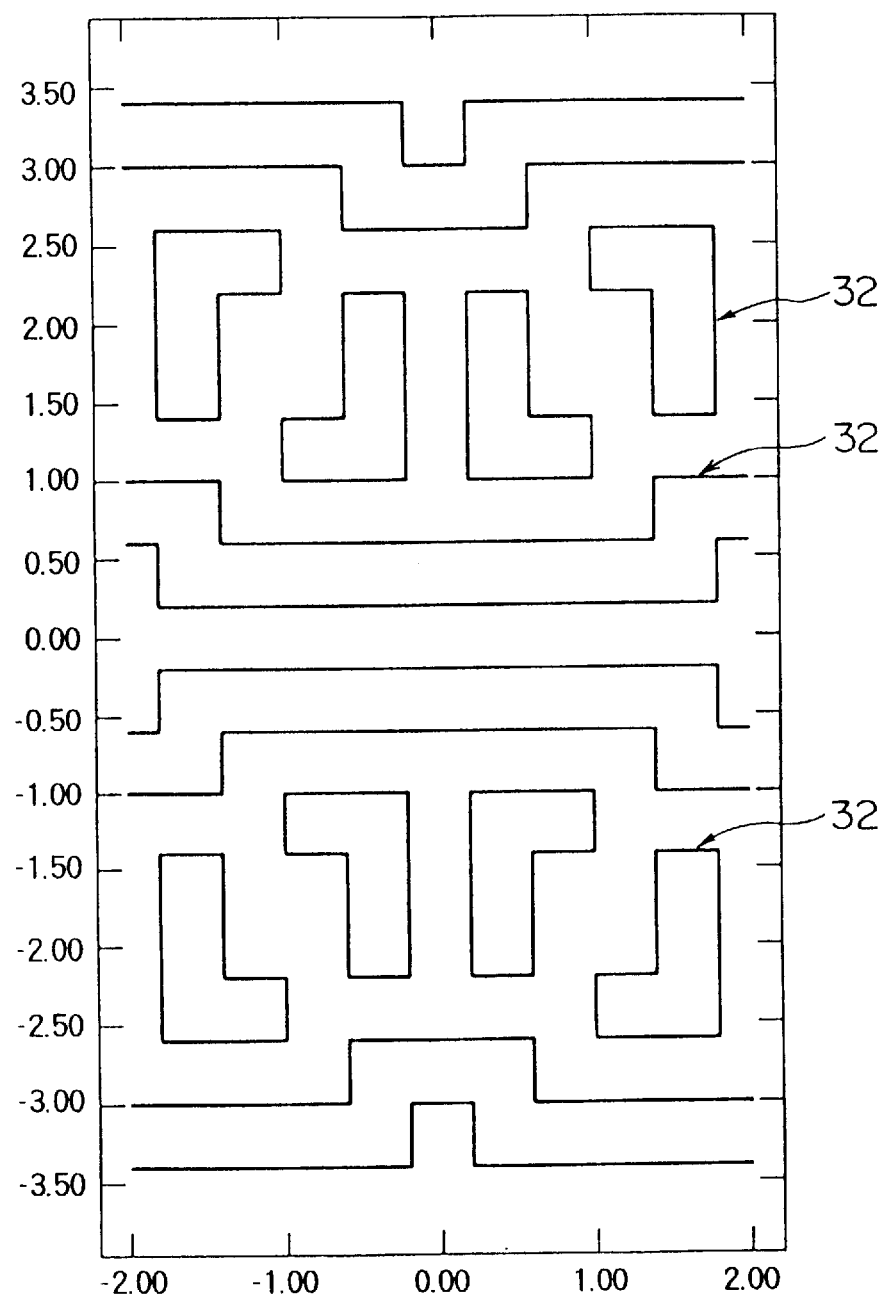
FIG. 27 is a plan view of the initial design pattern according to a still other embodiment.

FIG. 27 shows the design pattern 32 used in the present embodiment.

Figure 28:
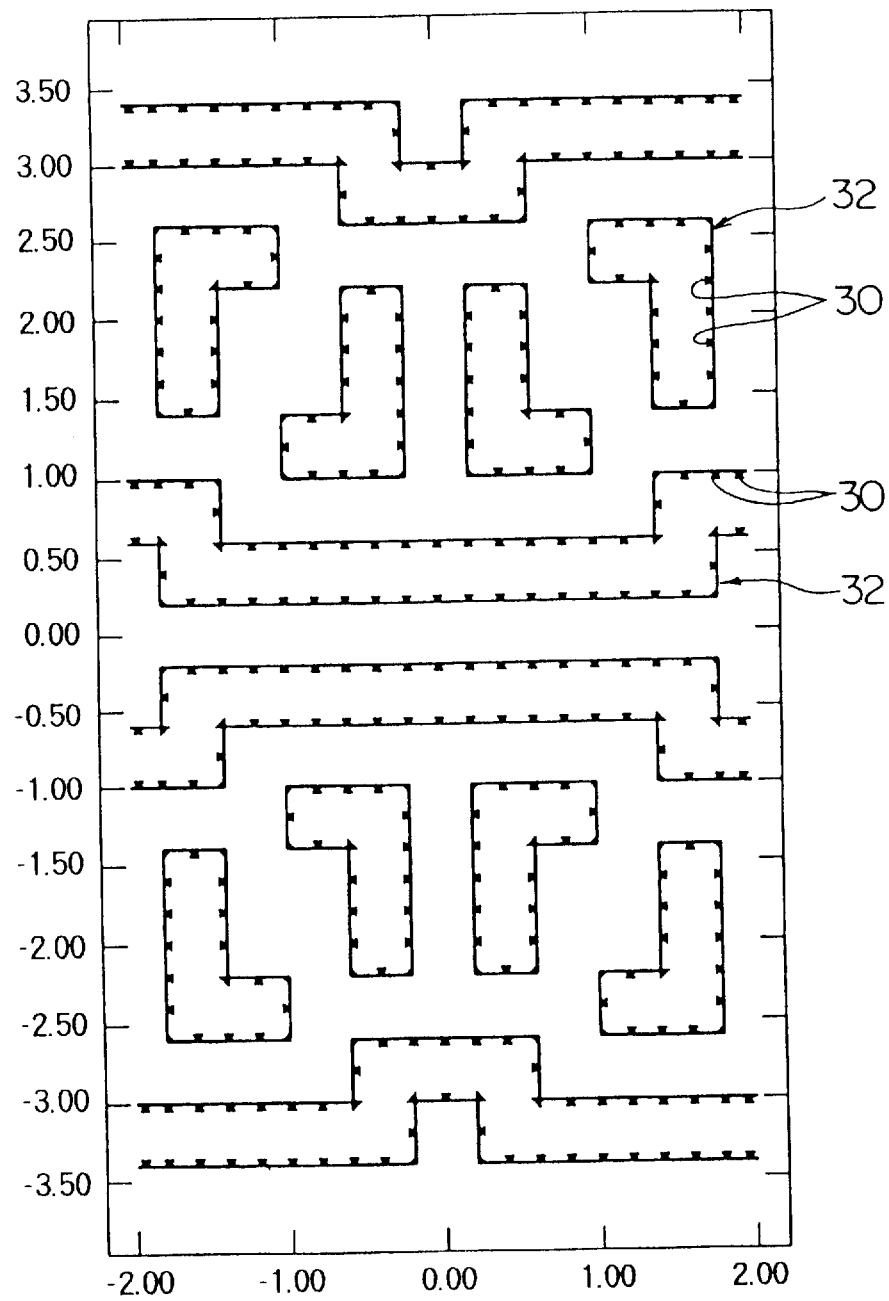
FIG. 28 is a plan view of one example of the method of arrangement of evaluation points according to a still other embodiment.

First, as shown in FIG. 28, the evaluation points 30 were provided at all corners and all sides of the design pattern at a pitch of 0.2 μm.

Figure 29:
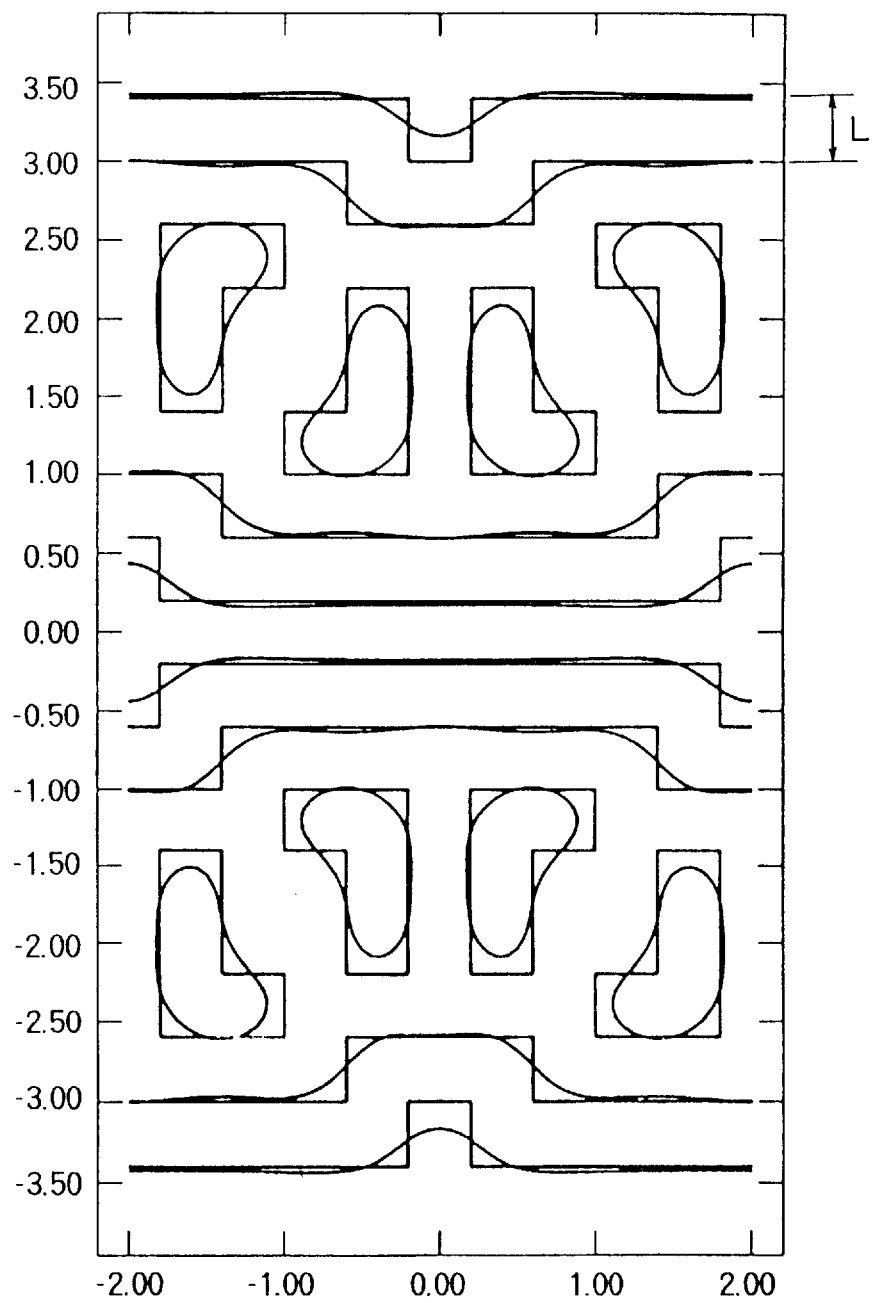
FIG. 29 is a plan view of a pattern showing the result of simulation at a focused state according to a still other embodiment.

Next, the light intensity distribution obtained where a mask having this design pattern as it was was transferred at a focused state was found, convolution integration was carried out according to the equation obtained by assigning α=0.22 in Equation (7), and contour lines obtained by slicing this integration value by the threshold value $E_{th}$ was found as the resist image (transfer image). The result is shown in FIG. 29. Note that, the threshold value $E_{th}$ was determined so that the line width L in FIG. 29 became 0.4 μm.

Figure 30:
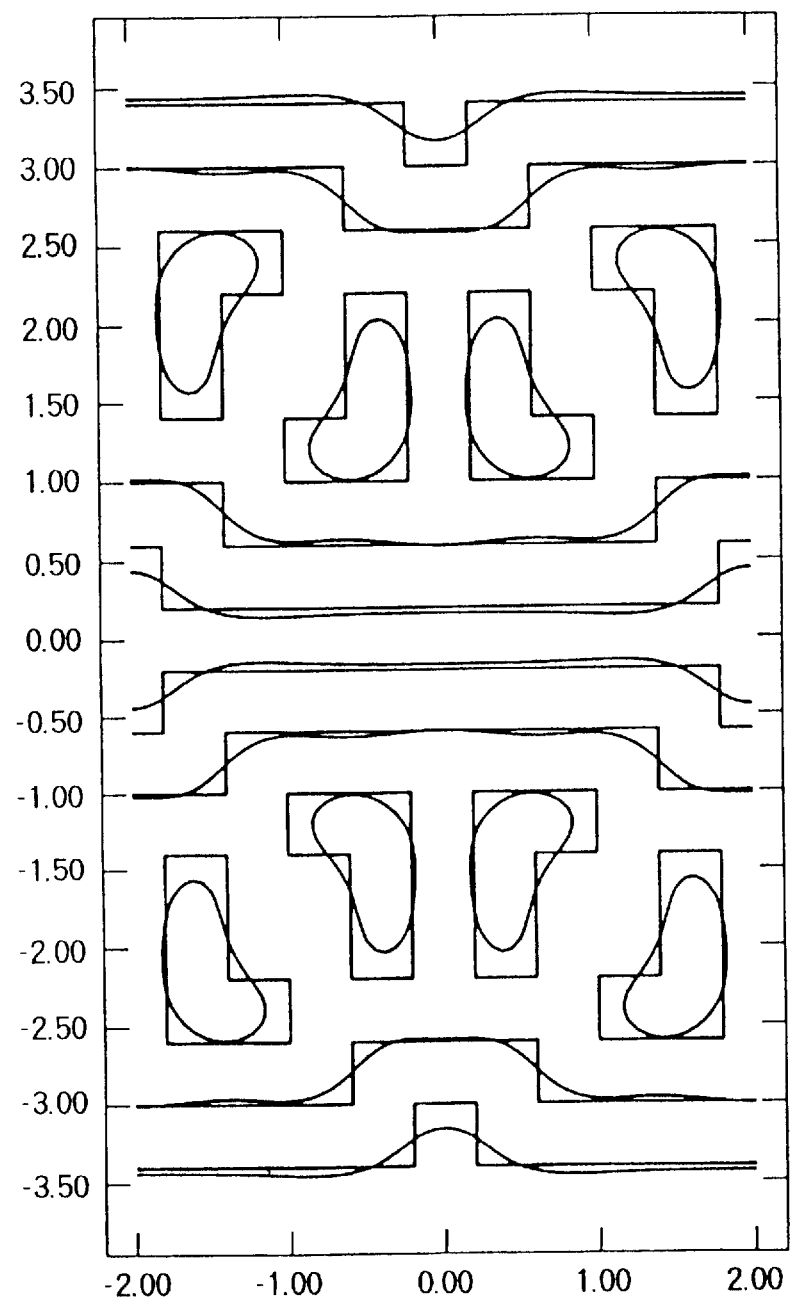
FIG. 30 is a plan view of a pattern showing the result of simulation at a defocused state according to a still other embodiment.

Further, the depth of focus required in the photolithographic step was defined as ±0.75 μm, convolution integration of the light intensity distribution and the Gaussian function in the case of a 0.75 μm defocus was found, and the contour lines sliced by the threshold value $E_{th}$ was found. The results are shown in FIG. 30.

Also, the margin of exposure required in the photolithographic step was set to ±10%, and in the two convolution integrations, the contour lines sliced at the height $E_{th}^-$ obtained by decreasing the threshold value $E_{th}$ by 10% were found as the resist image where the amount of exposure was increased by +10%, and the contour lines sliced at the height $E_{th}^+$ obtained by increasing the threshold value $E_{th}$ by 10% was found as a resist image where the amount of exposure was decreased by 10%, respectively.

By this, six types of resist images in total obtained by multiplying two types of the focal positions, i.e., the focus state and the defocused state of 0.75 μm, by three types of exposure amounts, i.e., the optimum exposure amount, 10% overdose exposure, and 10% underdose exposure, were found by the simulation means 10 shown in FIG. 1.

Subsequently, at all of the evaluation points, an amount of deviation (difference) was found by the procedure shown in FIG. 3A or FIG. 10 for the pattern boundary (edge) of six types of resist images.

Next, the mean value of the amount of deviation of six types of edges was found for every evaluation point found in this way. Note, in the present embodiment, as shown in FIG. 10, the target points 36 were set at the evaluation points 30 of the corners of the design pattern 32. As shown in FIG. 10, the target points 36 are set corresponding to the evaluation points 30 positioned at the convex corners or concave corners of the design pattern 32, the target points 36 were determined inside the corner (−0.08 μm) at the convex corners, and the target points 36 were determined outside (+0.08 μm) the corner at the concave corners.

In the present embodiment, in the comparison step of step S13 shown in FIG. 2, at the position where only the evaluation points 30 are set, the difference a between the simulated transfer image 34 and the design pattern 32 (refer to FIG. 10) is compared for every evaluation point 30. At the positions where the target points 36 are set, the difference b between the target point 36 and the transfer image 34 (refer to FIG. 10) is compared Then, in the deformation step of step S14 shown in FIG. 2, the design pattern 32 is deformed using the evaluation point 30 (not the target point) as the reference according to the differences a and b compared for every evaluation point 30 or every target point 36 so that the difference becomes small. In the present embodiment, the mask pattern edge in the vicinity of each evaluation point was moved in the reverse direction with respect to the mean value of the amount of deviation of the obtained edge by a procedure as shown in FIG. 3B. Here, the amount of movement of the pattern edge was set to the amount obtained by multiplying the mean value of the amount of deviation by 0.25.

Figure 31:
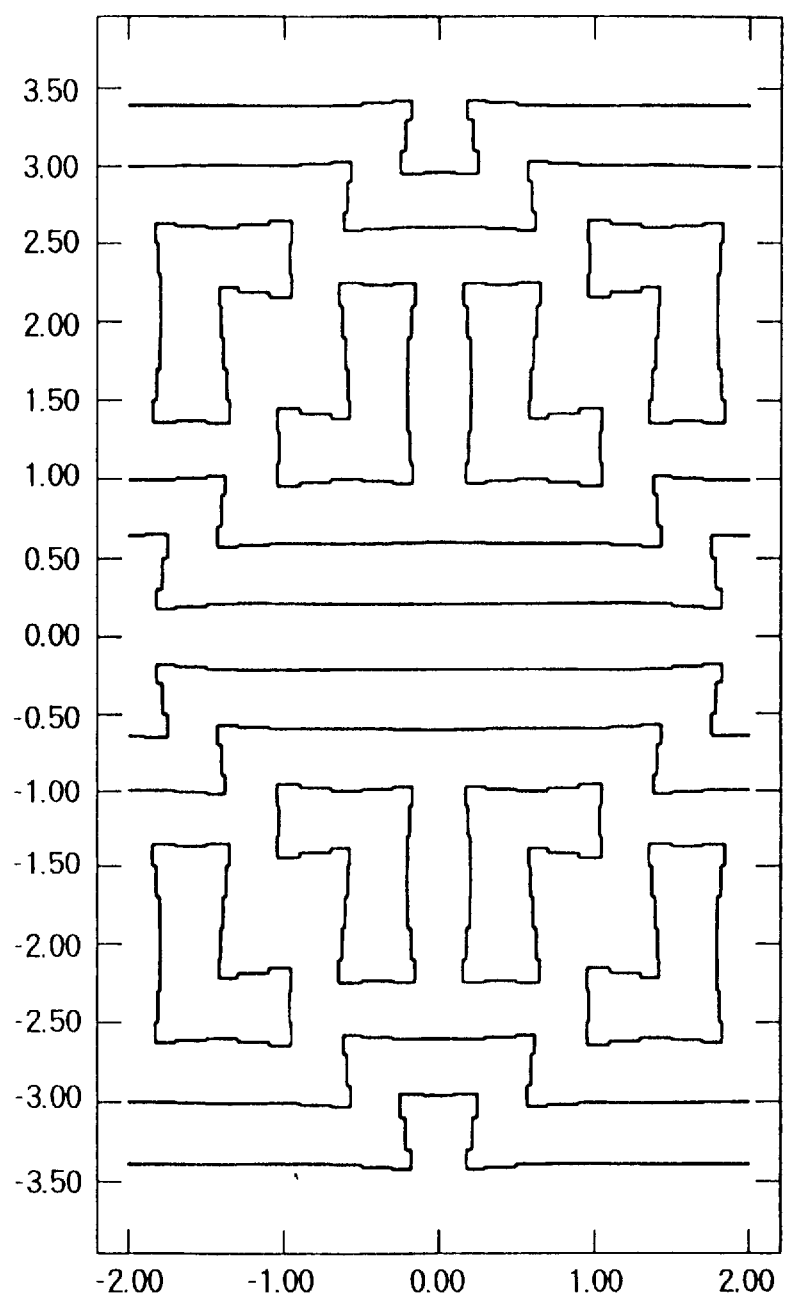
FIG. 31 is a plan view of one example of a mask pattern corrected by a single correction step according to a still other embodiment.

In this way, the corrected design pattern shown in FIG. 31 was obtained.

Figure 32:
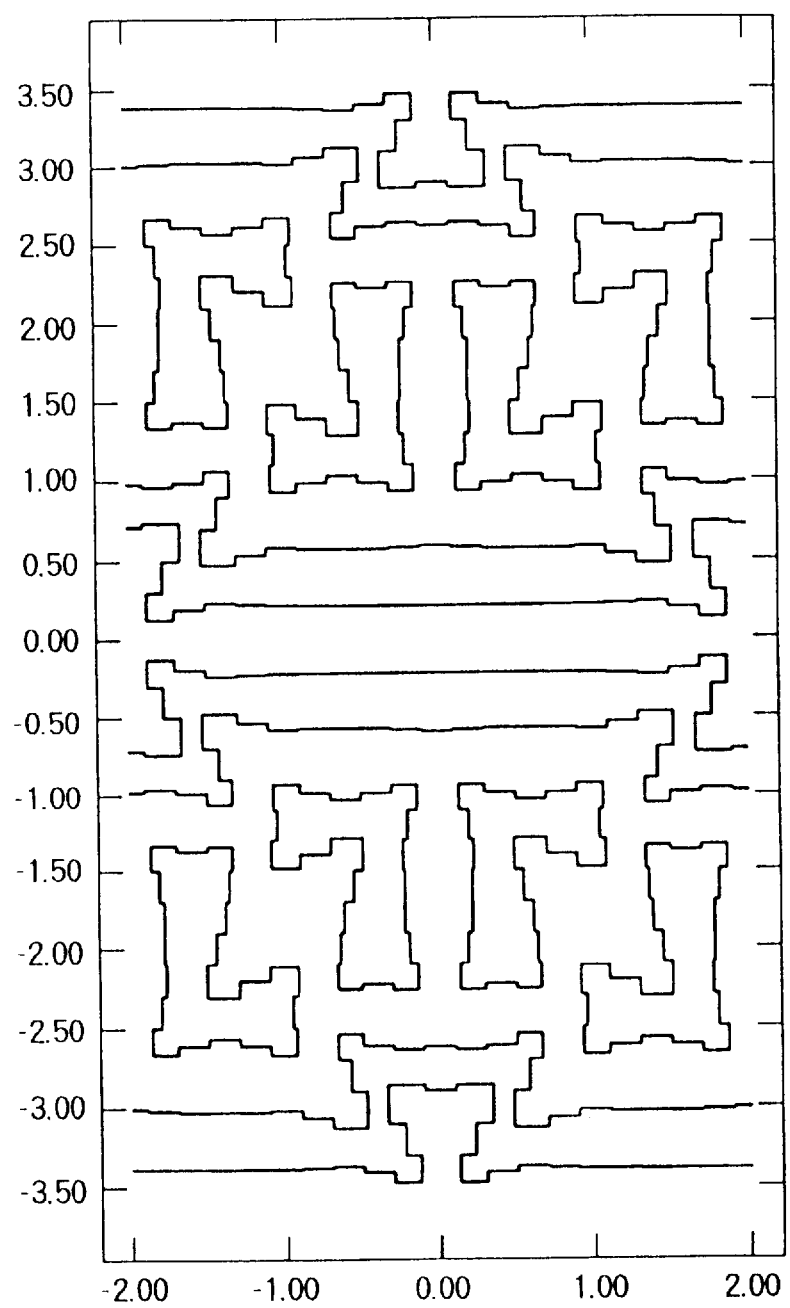
FIG. 32 is a plan view of one example of a mask pattern corrected by a plurality of repeated correction steps according to a still other embodiment.

Further, in these procedures, the positions of the evaluation points and the positions of the target points were maintained as they were, steps S12 to S14 shown in FIG. 2 by the simulation means 10, the comparison means 12, and the deformation means 14 shown in FIG. 1 were repeated four times by using the finished corrected pattern shown in FIG. 31 as the starting point, and a finished corrected mask pattern shown in FIG. 32 was obtained.

By this correction, it was possible to successfully reduce the 3σ, indicating the deviation of the six types of edge deviation amounts obtained by changing the exposure conditions at the evaluation points, to 0.104 μm in the present embodiment as compared with the 0.239 μm in the mask of the design pattern as it was.

Figure 33:
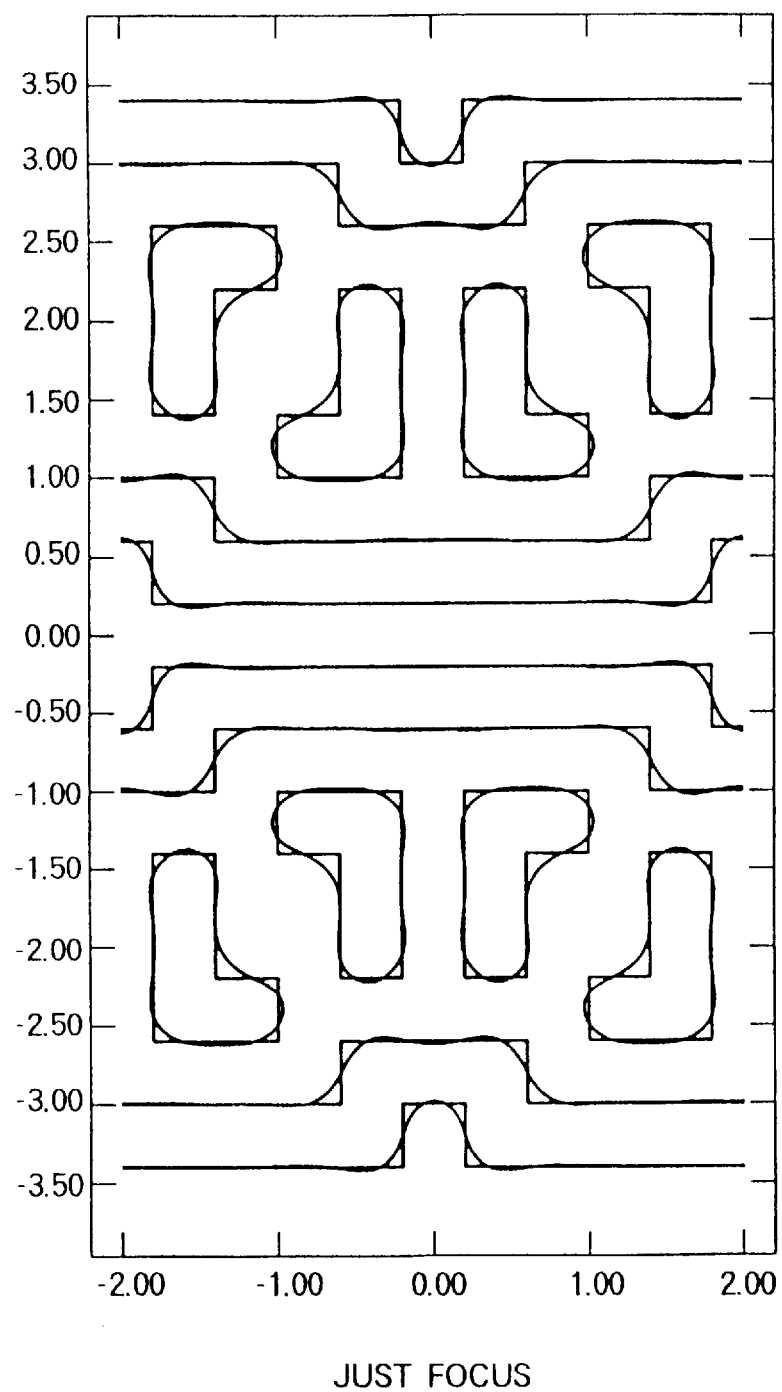
FIG. 33 is a plan view of a transfer image simulated at a focused state by using the finished corrected mask pattern shown in FIG. 32.
Figure 34:
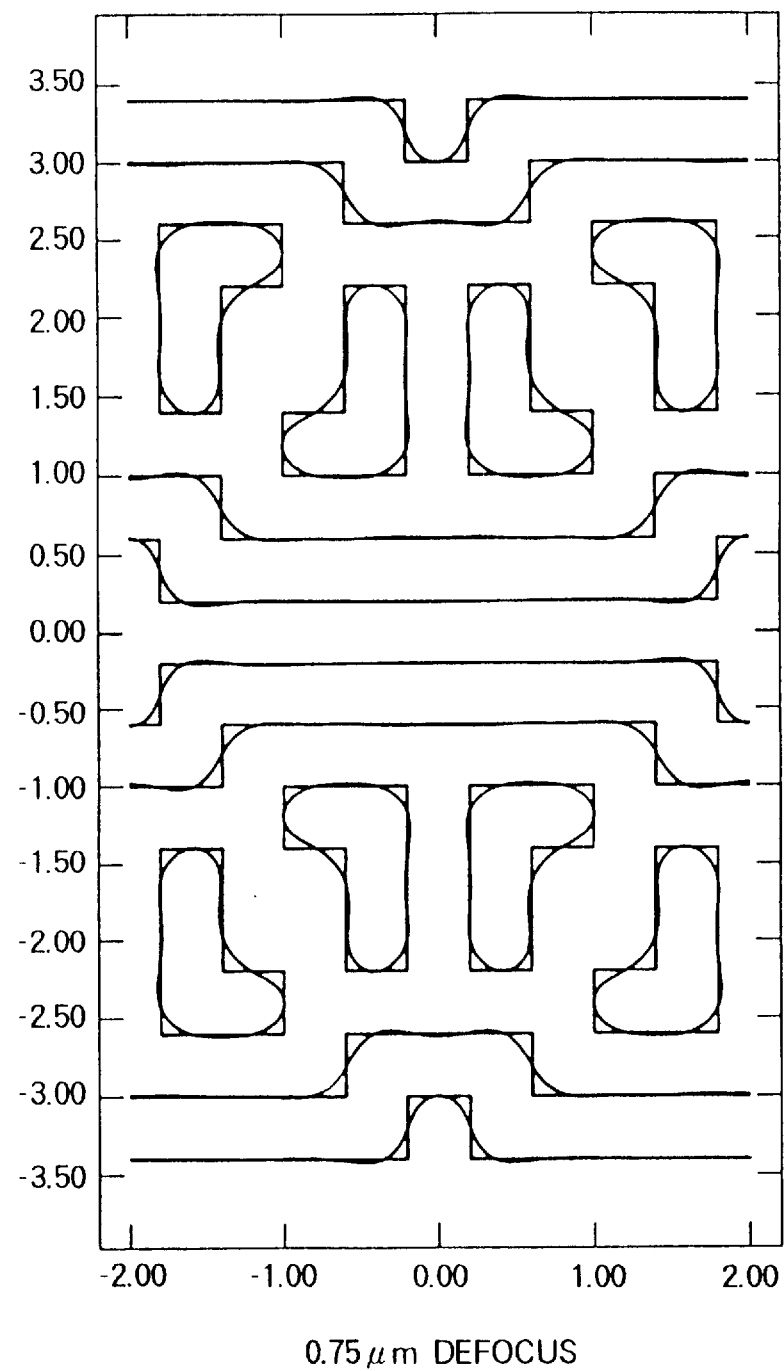
FIG. 34 is a plan view showing a transfer image simulated at a defocused by using the finished corrected mask pattern shown in FIG. 32.

Resist patterns at the focused state and at a defocused state of 0.75 μm, obtained by using the photomask having the mask pattern shown in FIG. 32, are shown in FIGS. 33 and 34, respectively. It was confirmed that a very good resist pattern was obtained in comparison with the resist pattern before correction shown in FIGS. 29 and 30.

By performing the exposure and by producing a semiconductor device by using a photomask having a mask pattern corrected by the method of correction according to the present invention, a semiconductor device having good electrical properties can be produced with a high manufacturing yield.

The present embodiment was confirmed to be effective also for particularly the correction of a mask pattern of a photomask used in photolithography using a phase shift.

Eighth embodiment

Figure 35:
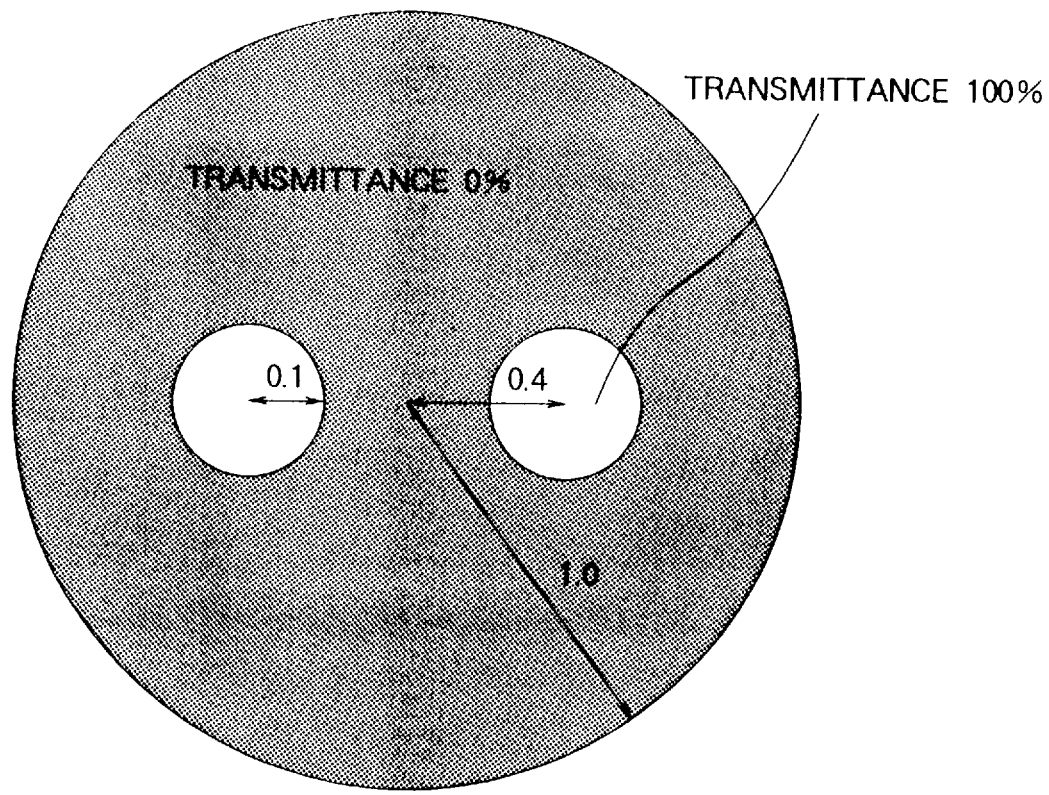
FIG. 35 is a graph of the distribution of transmittances.

The present embodiment is one where the method of the present invention is applied to a case where the pattern of an interconnection layer of a memory device of a 0.3 μm rule is exposed and transferred to a positive Novolak-based resist under conditions of an exposure wavelength of 365 nm and NA=0.50. At the exposure, the improvement of resolution is achieved by using an exposure light source having a distribution of transmittance as shown in FIG. 35. In the present embodiment, matters which are not particularly disclosed are similar to those of the above embodiments.

Figure 36:
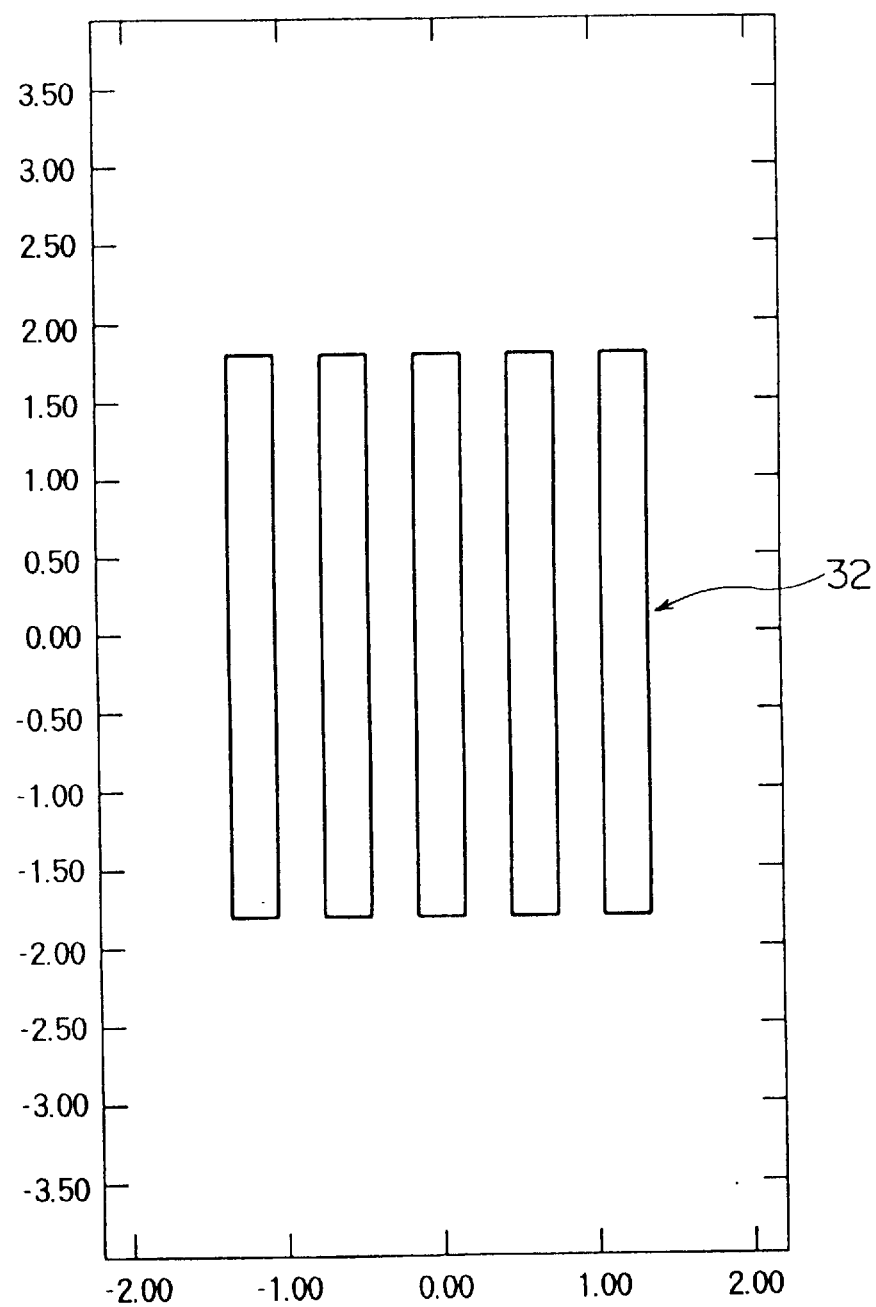
FIG. 36 is a plan view of the initial design pattern according to a still other embodiment.

FIG. 36 shows the design pattern 32 used in the present embodiment.

Figure 37:
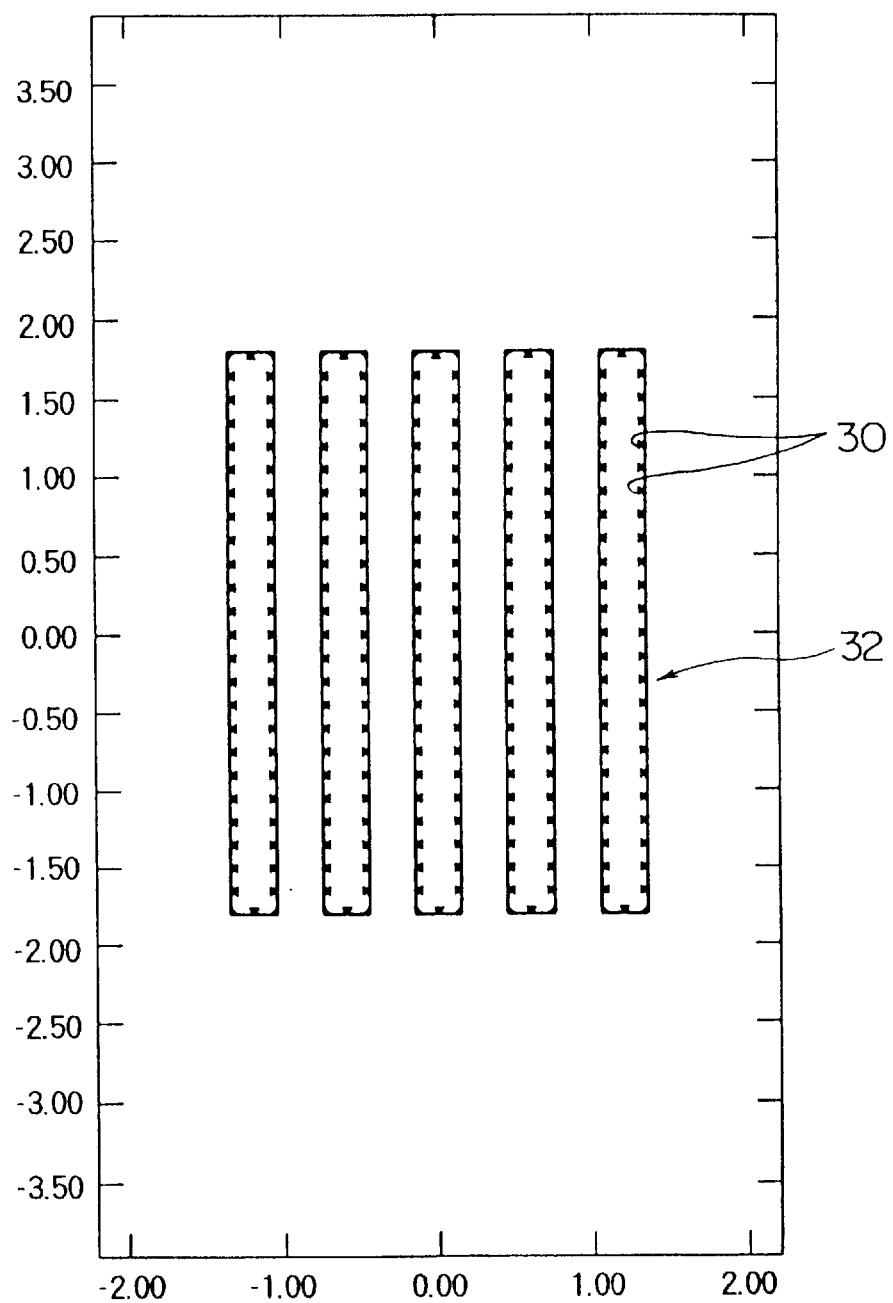
FIG. 37 is a plan view of one example of the method of arrangement of evaluation points according to a still other embodiment.

First, as shown in FIG. 37, the evaluation points 30 were provided at all corners and all sides of the design pattern at a pitch of 0.15 μm.

Figure 38:
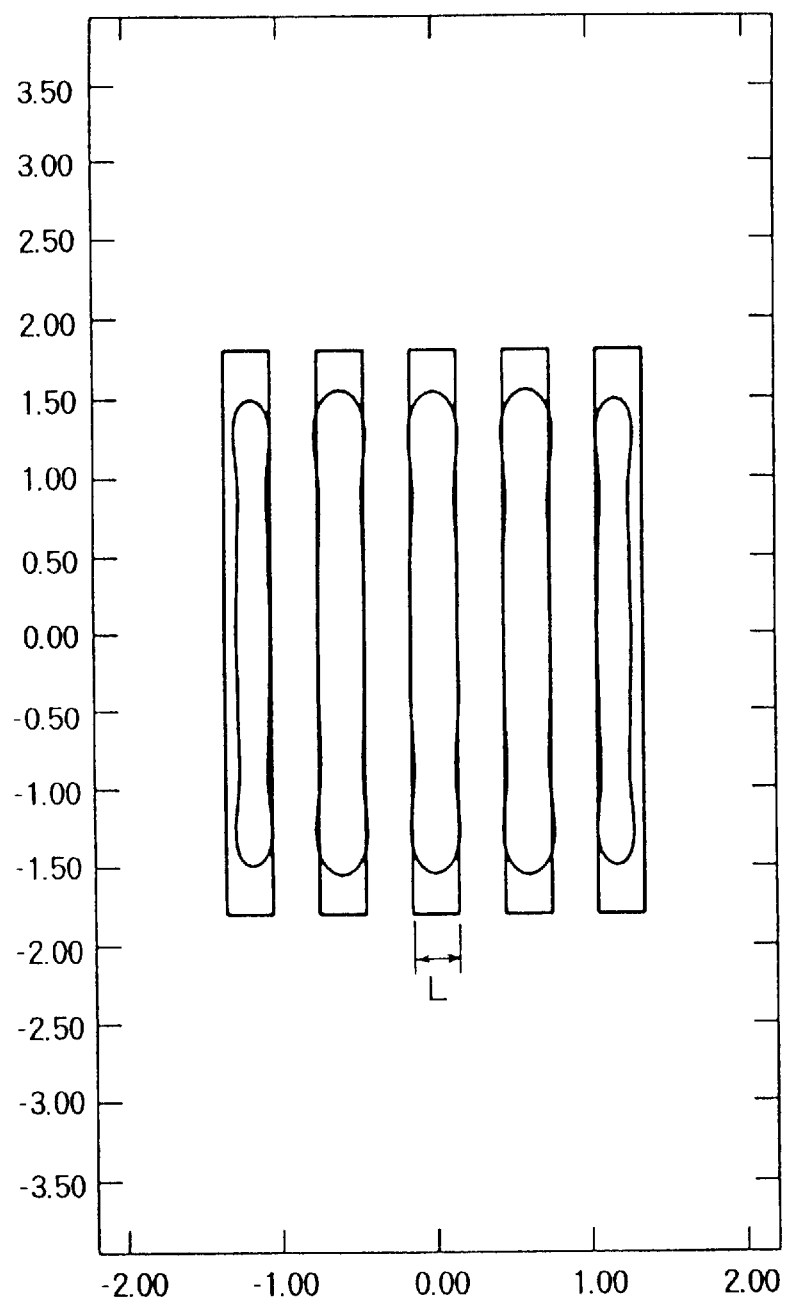
FIG. 38 is a plan view of the pattern showing the result of simulation at a focused state according to a still other embodiment.
Figure 39:
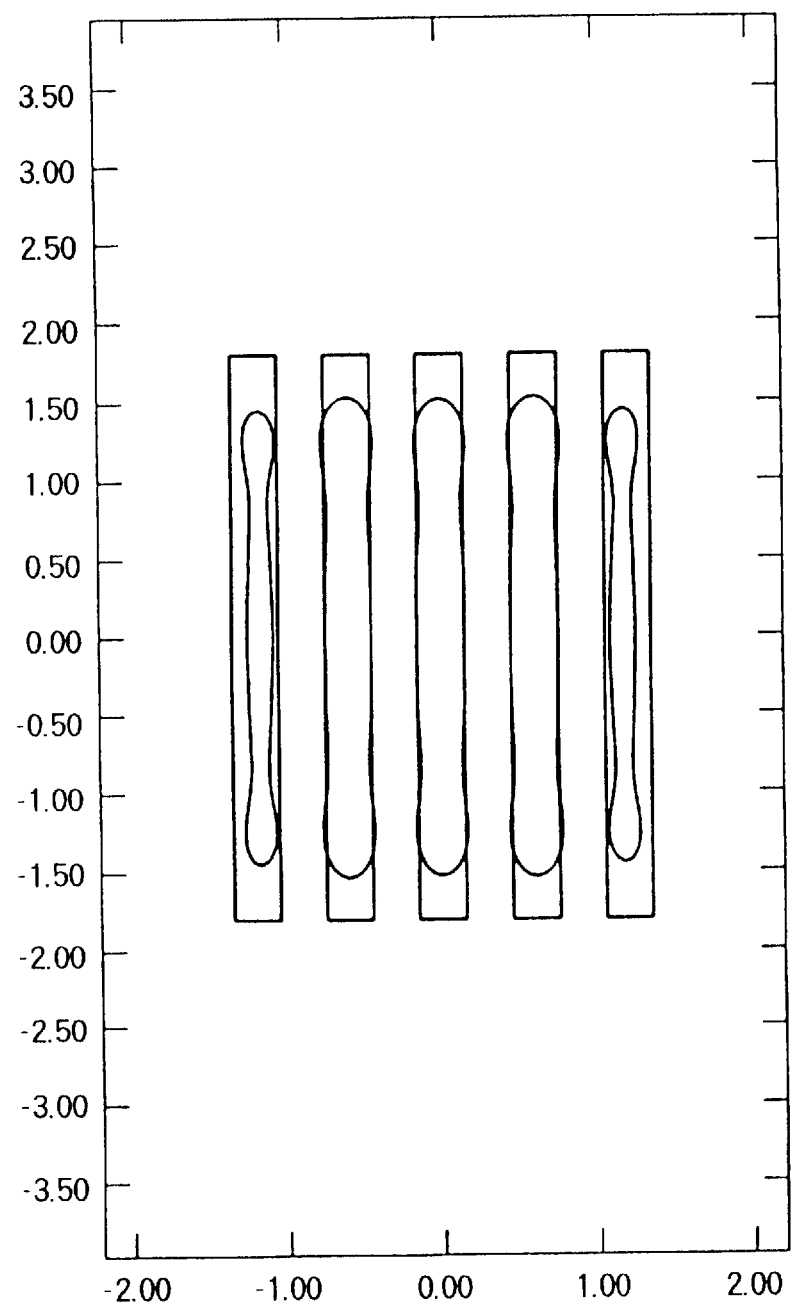
FIG. 39 is a plan view of a pattern showing the result of simulation at a defocused state according to a still other embodiment.

Next, the light intensity distribution obtained where the mask having this design pattern as it was was transferred at a focused state was found, convolution integration was carried out according to the equation obtained by assigning α=0.22 in Equation (7), and contour lines obtained by slicing this integration value by the threshold value $E_{th}$ were found as the resist image (transfer image). The result is shown in FIG. 39. Note that, the threshold value $E_{th}$ was determined so that the line width L in FIG. 38 became 0.3 μm.

Further, the depth of focus required in the photolithographic step was defined as ±0.50 μm, convolution integration of the light intensity distribution and the Gaussian function in the case of a 0.50 μm defocus was found, and the contour lines sliced by the threshold value $E_{th}$ were found. The results are shown in FIG. 39.

Also, the margin of exposure required in the photolithographic step was set to ±5%, and, in the two convolution integrations, the contour lines sliced at the height $E_{th}^-$ obtained by decreasing the threshold value $E_{th}$ by 5% were found as the resist image where the amount of exposure was increased by +5%, and the contour lines sliced at the height $E_{th}^+$ obtained by increasing the threshold value $E_{th}$ by 5% were found as the resist image where the amount of exposure was decreased by 5%, respectively.

By this, six types of resist images in total obtained by multiplying two types of the focal positions, i.e., the focused state and the defocused state of 0.75 μm, by three types of amounts of exposure, i.e., the optimum exposure amount, 5% overdose exposure, and 5% underdose exposure, were found by the simulation means 10 shown in FIG. 1.

Subsequently, at all of the evaluation points, an amount of deviation (difference) was found by the procedure shown in FIG. 3A or FIG. 10 with respect to the pattern boundary (edge) of six types of resist images.

Next, the mean value of the amount of deviation of six types of edges was found for every evaluation point found in this way. Note, in the present embodiment, as shown in FIG. 10, the target points 36 were set at the evaluation points 30 of the corners of the design pattern 32. As shown in FIG. 10, the target points 36 were set corresponding to the evaluation points 30 positioned at the convex corners or concave corners of the design pattern 32, the target points 36 were determined inside the corner (−0.06 μm) at the convex corners, and the target points 36 were determined outside (+0.06 μm) the corner at the concave corners.

In the present embodiment, in the comparison step of step S13 shown in FIG. 2, at the positions where only the evaluation points 30 were set, the difference a between the simulated transfer image 34 and the design pattern 32 (refer to FIG. 10) was compared for every evaluation point 30. At the positions where the target points 36 were set, the difference b between the target point 36 and the transfer image 34 (refer to FIG. 10) was compared Then, in the deformation step of step S14 shown in FIG. 2, the design pattern 32 is deformed using the evaluation point 30 (not the target point) as the reference according to the differences a and b compared for every evaluation point 30 or every target point 36 so that the difference becomes small. In the present embodiment, the mask pattern edge in the vicinity of each evaluation point was moved in the reverse direction with respect to the mean value of the amount of deviation of the obtained edge by a procedure as shown in FIG. 3B. Here, the amount of movement of the pattern edge was set to the amount obtained by multiplying the mean value of the amount of deviation by 0.25.

Figure 40:
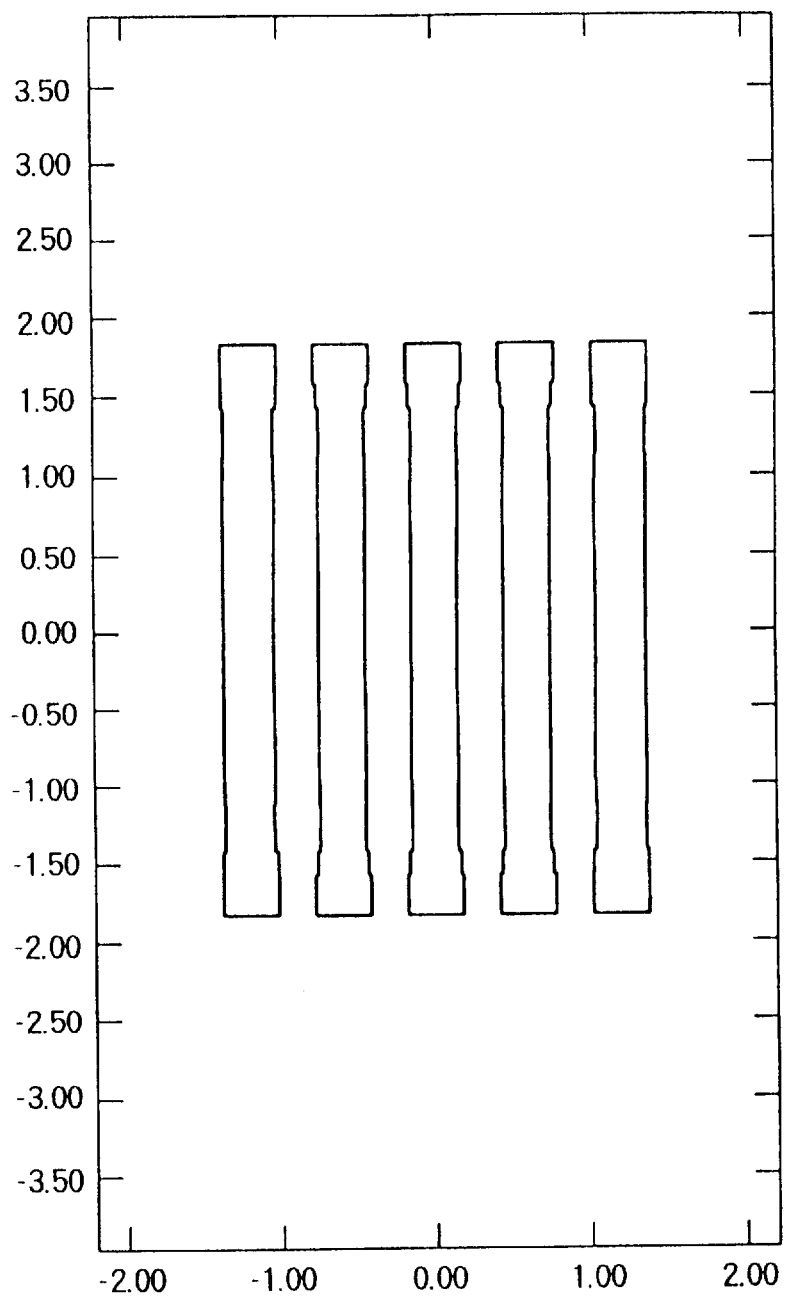
FIG. 40 is a plan view of one example of a mask pattern corrected by a single correction step according to a still other embodiment.

In this way, the corrected design pattern shown in FIG. 40 was obtained.

Figure 41:
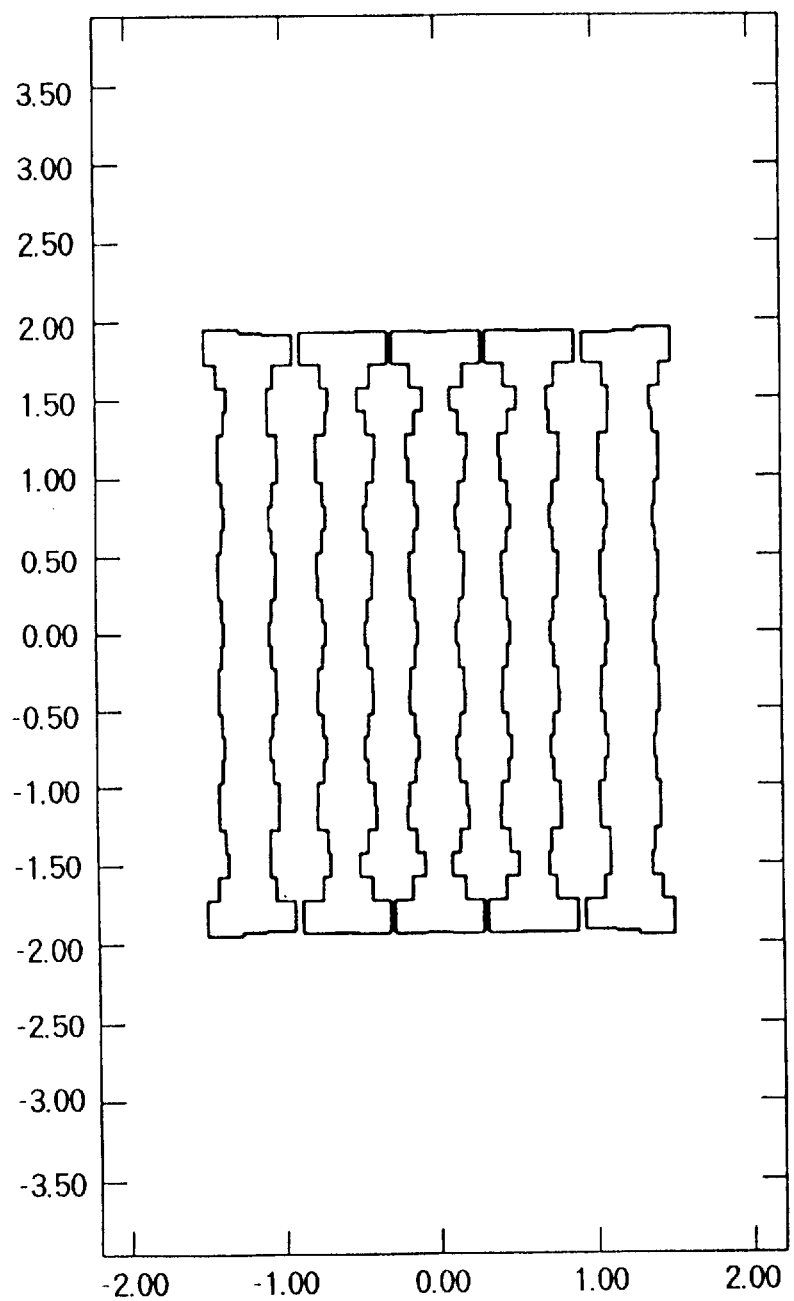
FIG. 41 is a plan view of one example of a mask pattern corrected by a plurality of repeated correction steps according to a still other embodiment.

Further, in these procedures, the positions of the evaluation points and the positions of the target points were maintained as they were, steps S12 to S14 shown in FIG. 2 by the simulation means 10, the comparison means 12, and the deformation means 14 shown in FIG. 1 were repeated four times by using the finished corrected pattern shown in FIG. 40 as the starting point, and a finished corrected mask pattern shown in FIG. 41 was obtained.

By this correction, it was possible to successfully reduce the 3σ, indicating the deviation of the six types of edge deviation amounts obtained by changing the exposure conditions at the evaluation points, to 0.081 μm in the present embodiment as compared with 0.257 μm in the mask of the design pattern as it was.

Figure 42:
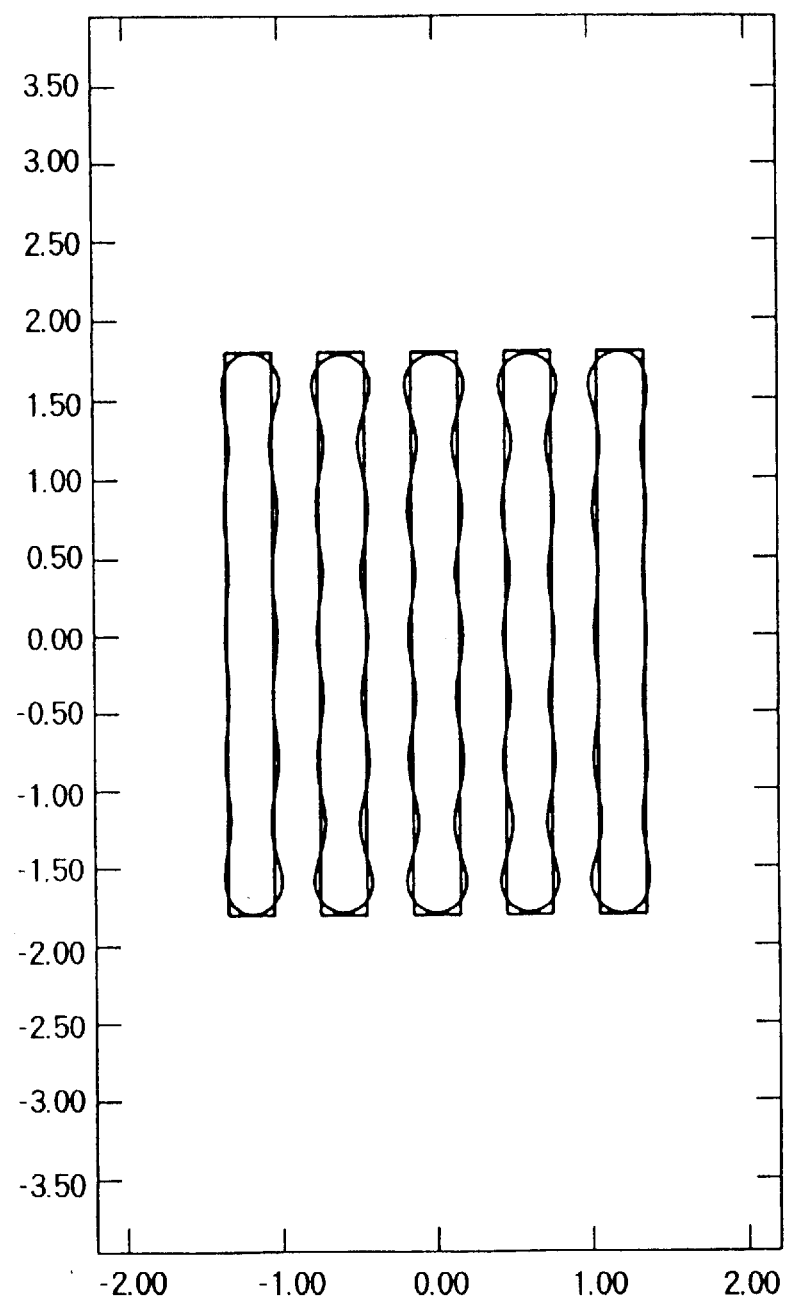
FIG. 42 is a plan view of a transfer image simulated at a focused state by using the finished corrected mask pattern shown in FIG. 41.
Figure 43:
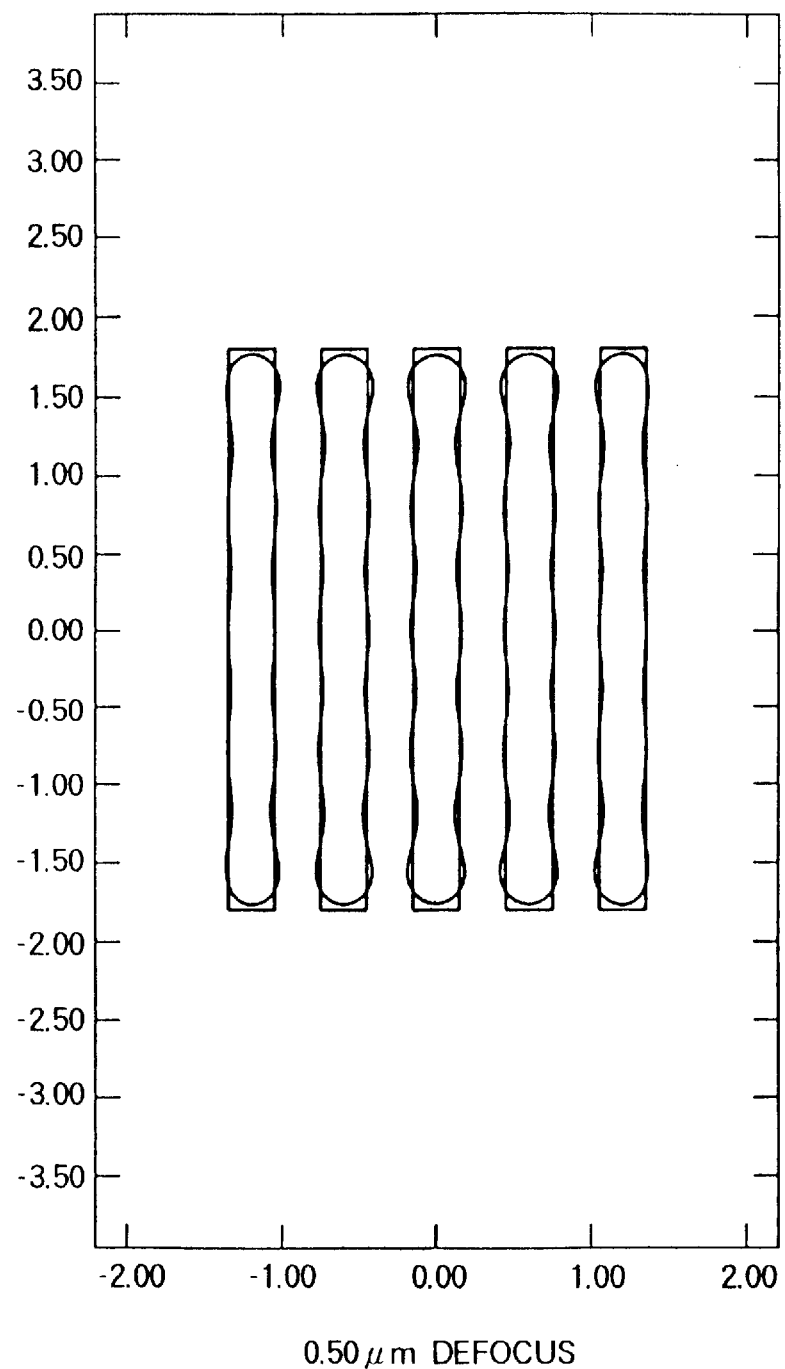
FIG. 43 is a plan view of the transfer image simulated at a defocused state by using the finished corrected mask pattern shown in FIG. 41.

Resist patterns at the focus state and at a defocused state of 0.50 μm, obtained by using a photomask having the mask pattern shown in FIG. 41, are shown in FIGS. 42 and 43, respectively. It was confirmed that a very good resist pattern was obtained in comparison with the resist pattern before correction shown in FIGS. 38 and 39.

By performing the exposure and by producing a semiconductor device using a photomask having a mask pattern corrected by the method of correction according to the present invention, a semiconductor device having good electrical properties can be produced with a high manufacturing yield.

The present embodiment was confirmed to be effective also for particularly the correction of a mask pattern of a photomask used in photolithography using a modified exposure light source.

Note that, the present invention is not restricted to the above embodiments and can be modified in various ways within the range of the present invention.

For example, the exposure conditions are not restricted to those of the above embodiments. Also, the photoresist to be used is not restricted to that of the above embodiments. Further, the mask pattern is not restricted to the above embodiments.

Further, also as the exposure method, the modified illumination and pupil filtering method can be used, and also, as the mask to be used, a phase shift mask such as a halftone system or reversion system can be adopted. These are not restricted to those of the above embodiments.

As explained above, according to the first method of correction of a mask pattern according to the present invention, it becomes possible to deform the mask pattern so that a transfer image near the desired design pattern is automatically obtained regardless of the shape of the mask pattern. Accordingly, the inconvenience possessed by the system of correcting the mask pattern by the trial and error system for every mask pattern can be eliminated.

By the second method of correction of a mask pattern according to the present invention, a transfer image where transfer conditions change within a range of the processing margin is considered (processing margin is considered), so the processing margin such as the margin of exposure and depth of focus is no longer reduced based on the corrected mask pattern. As a result, if the photolithography is carried out by using the photomask of this mask pattern, the manufacturing yield is improved.

By the third method of correction of a mask pattern according to the present invention, it becomes possible to make the transfer image transferred by the design pattern (including also the deformed design pattern) approach the transfer image which is obtained in the actual transfer process and correction of the mask pattern can be automatically carried out with a high precision.

By the fourth method of correction of a mask pattern according to the present invention, when deforming the mask pattern, the boundary line of the mask pattern in the vicinity of the evaluation point is moved in the reverse direction to the difference compared for every evaluation point exactly by an amount obtained by multiplying the magnitude of difference by a constant coefficient (0.1 or more and less than 1), so the transfer image obtained by the mask pattern after correction will gradually approach the design pattern.

In the fifth method of correction of a mask pattern according to the present invention, for example, at the convex corners, the target points are determined inside the corner, and, at the concave corners, the target points are determined outside the corner, and correction is applied to the design pattern so that the transfer image approaches these target points, so the transfer image can be made to approach the design pattern well as a whole. As a result, bridges, disconnections, etc. between parts of the pattern can be prevented well.

I claim:

1. A method for correcting a mask pattern in which the mask pattern of a photomask to be used in a photolithographic step is deformed so that a transfer image near a desired design pattern is obtained, comprising the steps of:

arranging a plurality of evaluation points along an outer periphery of the desired design pattern;

simulating the transfer image to be obtained where exposure is carried out under predetermined transfer conditions by using a photomask of the design pattern based on the evaluation points;

comparing a difference between the simulated transfer image and the design pattern for every evaluation point; and deforming the design pattern according to the difference compared for every evaluation point so that the difference becomes smaller.

2. The method for correcting as set forth in claim 1, wherein the simulation step to the deformation step are repeated at least one time using the design pattern deformed by the deformation step.

3. The method for correcting a mask pattern as set forth in claim 1 or 2, wherein in the simulation step, transfer images are simulated under a number of types of transfer conditions based on a combination of a plurality of amounts of exposure within a range of a preliminary set margin of exposure and a plurality of focal positions within the range of the preliminary set depth of focus to obtain a plurality of transfer images; and in the comparison step, the difference of each of the plurality or transfer images from the design pattern is compared for every evaluation point to calculate a plurality of types of differences for every evaluation point; and in the deformation step, the design pattern is deformed so that the plurality of types of differences for every evaluation point become small according to a predetermined reference.

4. The method for correcting a mask pattern as set forth in claim 3, wherein the predetermined reference in the deformation step is a reference such that a mean value of the plurality of types of differences for every evaluation point becomes the minimum.

5. The method for correcting a mask pattern as set forth in claim 3, wherein the predetermined reference is a reference such an absolute value of the maximum difference among the plurality of types of differences for every evaluation point becomes the minimum.

6. The method for correcting a mask pattern as set forth in claim 3, wherein the predetermined reference is a reference such that a square average of the plurality of types of differences for every evaluation point becomes the minimum.

7. The method for correcting a mask pattern as set forth in claim 1 or 3, wherein, in the simulation step, two-dimensional light intensities on a substrate are calculated based on the design pattern and exposure conditions;

effects of the light intensities at a plurality of peripheral positions on exposure energy at an arbitrary position are calculated and cumulatively added based on the light intensities at the peripheral positions of that arbitrary position on the two-dimensional plane of the substrate and the distance between that particular position and the peripheral positions, whereby a latent image formation intensity at that arbitrary position is calculated on the two-dimensional plane of the substrate; and further comprising the steps of:

finding a distribution of the latent image formation intensities on the two-dimensional plane of the substrate;

determining a threshold value of the latent image formation intensity corresponding to the amount of exposure and development conditions;

finding contour lines at the threshold value for the distribution of the latent image formation intensities; and calculating the pattern defined by the contour lines as a transfer image.

8. The method for correcting a mask pattern as set forth in claim 1 or 3, wherein, in the deformation step, the boundary line of the mask pattern adjacent the evaluation point is moved in a reverse direction of the difference compared for every evaluation point by exactly an amount obtained by multiplying the magnitude of difference by a constant coefficient.

9. The method for correcting a mask pattern as set forth in claim 8, wherein the coefficient is larger than 0 and less than 1.

10. The method for correcting a mask pattern as set forth in claim 1 or 3, wherein, in the evaluation point arrangement step, a plurality of evaluation points are arranged along an outer periphery of the pattern of the desired design pattern and, at the same time, target points are set at predetermined evaluation points separate from the evaluation points;

in the comparison step, the difference between the simulated transfer image and the design pattern is compared for every evaluation point at positions at which only the evaluation points are set and a difference of the target points and the transfer image is compared at the positions where the target points are set; and in the deformation step, the design pattern is deformed so that the difference becomes smaller depending upon the difference compared for every evaluation point or every target point.

11. The method for correcting a mask pattern as set forth in claim 10, wherein the target points are set corresponding to the evaluation points positioned at convex corners or concave corners of the design pattern, the target points are determined inside the corner at the convex corners, and the target points are determined outside the corner at the concave corners.

12. A method for correcting a mask pattern comprising the steps of:

generating a simulated transfer image;

comparing a difference between the simulated transfer image and a design pattern for a plurality of evaluation points located on a periphery of a desired design pattern; and deforming the design pattern according to the difference for the evaluation points so that the difference becomes smaller.

* * * * *